(12) United States Patent
Notani

(10) Patent No.: US 6,563,355 B2
(45) Date of Patent: May 13, 2003

(54) RECOVERY CIRCUIT GENERATING LOW JITTER REPRODUCTION CLOCK

(75) Inventor: Hiromi Notani, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/897,931

(22) Filed: Jul. 5, 2001

(65) Prior Publication Data

US 2002/0025015 A1 Feb. 28, 2002

(30) Foreign Application Priority Data

Aug. 31, 2000 (JP) ........................................ 2000-262770

(51) Int. Cl.⁷ ................................................ H03K 5/01
(52) U.S. Cl. ........................................ 327/165; 327/156
(58) Field of Search ................................ 327/142, 144, 327/145–150, 152, 153, 155–159, 165; 375/374–376

(56) References Cited

U.S. PATENT DOCUMENTS 6,041,090 A * 3/2000 Chen ........................... 327/148
6,114,888 A * 9/2000 Walley ........................ 327/147
6,181,758 B1 * 1/2001 Trimmel et al. ............ 327/147
6,323,910 B1 * 11/2001 Clark, III .................... 327/142

OTHER PUBLICATIONS

Charles R. Hogge, Jr., "*A Self Correcting Clock Recovery Circuit*", Monolithic Phase–Locked Loops and Clock Recovery Circuits, pp–249–251, Reprinted from IEEE Journal of Lightwave Technology, vol. LT–3, pp. 1312–1314, Dec. 1985.

* cited by examiner

Primary Examiner—My-Trang Nu Ton
(74) Attorney, Agent, or Firm—McDermott, Will & Emery

(57) ABSTRACT

When an up signal UP is inputted, a switch is turned on and thereby a capacitor is charged to raise a control voltage VC. Further, when a down signal DWN is inputted, a switch is turned on and a capacitor discharges to hold the down signal DWN in the capacitor. Then, when a switch is turned on by a transmission signal EXE, an electric charge is injected into the capacitor to lower the control voltage VC. Further, when a switch is turned on by a reset signal RST, the capacitor is charged by an amplifier to cancel the down signal DWN. As a result, a low jitter reproduction clock can be generated regardless of an operating frequency.

10 Claims, 24 Drawing Sheets

RECOVERY CIRCUIT GENERATING LOW JITTER REPRODUCTION CLOCK

BACKGROUND OF THE INVENTION

1. Field of the Invention

The present invention relates to a recovery circuit generating a reproduction clock in synchronism with received data in a receiving section of a communication apparatus and particularly, to a recovery circuit generating a low jitter reproduction clock.

2. Description of the Background Art

A recovery circuit generating a reproduction clock based on received data in a receiving section of a communication apparatus transmitting/receiving data compares a phase of reproduction clock with a phase of received data to have the reproduction clock to be synchronized with the received data. Received data in the receiving section is a NRZ (Non-Return Zero) signal and a reproduction clock is a RZ (Return Zero) signal; therefore comparison of both in phase has to be performed at edges of the data.

Referring to FIG. 24, a conventional phase comparator circuit 500 included in a recovery circuit is constituted of: flip-flops 510 and 520; and EX-OR gates 530 and 540. The flip-flop 510 is driven in synchronism with the rising edge of a reproduction clock CLK, receives received data DIN as an input signal to output output signals to the flip-flop 520 and the EX-OR gates 530 and 540. The flip-flop 520 is driven in synchronism with the falling edge of the reproduction clock CLK, receives an output signal of the flip-flop 510 and outputs an output signal to the EX-OR gate 540. The EX-OR gate 530 receives the received data and an output signal of the flip-flop 510 as input signals, performs an exclusive OR operation on the two input signals to output an up signal UP. Further, the EX-OR gate 540 receives an output signal of the flip-flop 510 and an output signal of the flip-flop 520 as inputs, performs an exclusive OR operation on the two signals to output a down signal DWN.

Referring to FIG. 25B, when a reproduction clock CLK is delayed as compared to received data in phase, the flip-flop 510 outputs a signal D1 in synchronism with the rising edge of the reproduction clock CLK, while the exclusive OR gate 530 performs an exclusive OR operation on the received data DIN and the signal D1 to output an up signal UP. Further, the flip-flop 520 holds the output signal D1 of the flip-flop 510 in synchronism with the falling edge of reproduction clock CLK to output a signal D2. The exclusive OR gate 540 performs an exclusive OR operation on the signals D1 and D2 to output a down signal DWN. In this case, a width of the up signal UP is larger than that of the down data DWN. Accordingly, when the reproduction clock CLK is delayed as compared to the received data DIN in phase, the phase comparator circuit 500 outputs the up signal UP with a larger width.

Further, with reference to FIG. 25C, when reproduction clock CLK leads received data DIN in phase, a width of a down signal is larger than that of an up signal UP. Accordingly, when the reproduction clock CLK leads the received data DIN in phase, the phase comparator circuit 500 outputs a down signal DWN with a larger width.

Referring to FIG. 25A, when a phase of a reproduction clock CLK coincides with a phase of received data DIN, the phase comparator circuit 500 outputs an up signal UP and a down signal DWN, both of the same width.

That is, the phase comparator circuit 500 outputs an up signal UP and a down signal DWN, when an edge of received data is inputted, in any of cases where in phase, a reproduction clock CLK is delayed as compared to received data DIN, leads data DIN and coincides with data DIN. When reproduction clock CLK is delayed as compared to received data DIN in phase, a phase of the reproduction clock CLK is adjusted such that a width of an up signal is narrowed and comes to be the same as that of a down signal. Further, when reproduction clock CLK leads received data in phase, a phase of the reproduction clock CLK is adjusted such that a width of a down signal DWN is narrowed and comes to be the same as that of an up signal UP.

Phase adjustment of a reproduction clock is performed by an operation in which a control voltage based on a comparison result in phase of the phase comparator circuit 500 is outputted to a voltage controlled oscillator and a phase of the reproduction clock CLK is altered according to a level of the control voltage. That is, a capacitor is connected between an output node supplying a control voltage to the voltage controlled oscillator and a ground node, an electric charge corresponding to a width of an up signal is charged in the capacitor to raise the control voltage or an electric charge corresponding to a width of a down signal is discharged from the capacitor to lower the control voltage, whereby the control voltage is adjusted such that a phase of a reproduction clock CLK coincides with a phase of received data DIN.

Hence, when reproduction clock CLK is delayed as compared to received data DIN in phase, charging of the capacitor by an up signal UP and discharging of the capacitor by a down signal DWN are alternately repeated and in such repetitions of charging and discharging, a charge time of the capacitor by up signals is adjusted to be totally longer than a discharge time of the capacitor by down signals, with the result that the control voltage gradually rises. Further, when a reproduction clock CLK leads received data DIN in phase, charging of the capacitor by an up signal UP and discharging of the capacitor by a down signal DWN are alternately repeated and in such repetitions of charging and discharging, a discharge time of the capacitor by down signals DWN is adjusted to be totally longer than a charge time of the capacitor by up signals UP, with the result that the control voltage gradually falls. Still further, when a phase of reproduction clock CLK coincides with a phase of received data DIN, charging of the capacitor by up signals UP and discharging of the capacitor by down signals DWN are alternately repeated such that a charge time of the capacitor by up signals UP and a discharge time by down signals DWN are totally equal to each other and as a result, the control voltage is held unchanged, as a whole, though process.

In a prior art recovery circuit, however, even when a phase of a reproduction clock CLK coincides with a phase of received data DIN, an up signal and a down signal are repeatedly outputted at edges of received data; therefore charging of the capacitor by up signals UP and discharging of the capacitor by down signals DWN are repeated such that a control voltage supplied to a voltage controlled oscillator is held at a constant value. With such an operation adopted, when intervals between the charging and the discharging are gradually longer, a problem arose since the timing of voltage adjustment in the voltage controlled oscillator is shifted, thereby producing jitter in the reproduction clock CLK.

SUMMARY OF THE INVENTION

The present invention has been made in order to solve such a problem and it is accordingly an object of the present invention is to provide a recovery circuit capable of generating a low jitter recovery clock regardless of an operating frequency.

A recovery circuit according to the present invention includes: a phase comparator circuit comparing a phase of a reproduction clock with a phase of received data, outputting an up signal when the reproduction clock is delayed as compared to the received data in phase and an edge of the received data has been detected in a first period in which the reproduction clock is a first logic, and outputting a down signal composed of a first component having detected an edge of the received data in a second period in which the reproduction clock is a second logic and a second component having detected that a logic of the received data is constant in the second period when the reproduction clock leads the received data in phase; a control voltage adjusting circuit raising a control voltage when the up signal is inputted, lowering the control voltage when the first component of the down signal is inputted and canceling the second component of the down signal to hold the control voltage when the second component of the down signal is inputted; and a voltage controlled oscillator generating a reproduction clock whose phase is altered according to a level of the control voltage to output the generated reproduction clock to the phase comparator circuit.

In a recovery circuit according to the present invention, when a reproduction clock is delayed as compared to received data in phase, an up signal having detected an edge of the received data is outputted to the control voltage adjusting circuit from the phase comparator circuit. Further, when the reproduction clock leads the received data in phase, a first component of a down signal having detected an edge of the received data is outputted to the control voltage adjusting circuit from the phase comparator circuit. Furthermore, a second component of the down signal bearing no relation to an edge of the received data is also detected and outputted to the control voltage adjusting circuit from the phase comparator circuit. In this situation, the control voltage adjusting circuit not only raises or lowers a voltage level of a control voltage based on the up signal or the first component of the down signal to adjust the control voltage, but also cancels the second component of the down signal. Then, the voltage controlled oscillator adjusts a phase of the reproduction clock based on the control voltage from the control voltage adjusting circuit. Hence, according to the present invention, not only can a phase of a reproduction clock be forced to coincide with a phase of received data, but a low jitter reproduction clock can also be generated in this coincidence state.

The control voltage adjusting circuit preferably includes: a loop filter raising or lowering the control voltage based on a supplied electric charge; a charge pump circuit supplying a first electric charge for raising the control voltage based on the up signal and supplying a second electric charge for lowering the control voltage based on the down signal; and a sampling circuit supplying the first electric charge to the loop filter circuit, and supplying the second electric charge to the loop filter circuit after holding the second electric charge for a prescribed period when the first component is inputted and canceling the second electric charge when the second component is inputted.

In the control voltage adjusting circuit, when an up signal is inputted, a first electric charge is supplied to the loop filter from the charge pump circuit to raise a control voltage. Further, when the first component of a down signal is inputted, the charge pump circuit supplies a second electric charge to the loop circuit through the sampling circuit. That is, the charge pump circuit receives an electric charge corresponding the first component from the sampling circuit and the sampling circuit receives an electric charge corresponding to the first component from the loop filter circuit, and thereby the second electric charge for lowering the control voltage is transmitted to the loop filter circuit from the charge pump circuit. Furthermore, when the second component is inputted, the charge pump circuit supplies the second electric charge to the sampling circuit and the sampling circuit cancels the second electric charge. The loop filter circuit then raises the control voltage based on the first electric charge supplied and lowers the control voltage based on the second electric charge supplied. Hence, according to the present invention, an up signal and a first component of a down signal are transmitted to the loop filter circuit with supply of an electric charge and a second component of the down signal is transmitted to the sampling circuit with supply of an electric charge and thereby canceled; therefore, phase adjustment of a reproduction clock and generation of a low jitter clock can be realized by an analog circuit.

It is preferable that the phase comparator circuit of the recovery circuit further outputs a transmission signal for transmitting the second electric charge to the loop filter circuit when the first component is inputted and a reset signal for canceling the second electric charge when the second component is inputted; and the sampling circuit performs sampling of and holds the second electric charge when the down signal is inputted to the charge pump circuit, is rendered to be conductive with the loop filter when the transmission signal is inputted, and holds the control voltage at a constant level and equalizes a sampling value to the control voltage when a reset signal is inputted.

The sampling circuit discharges an electric charge to the charge pump circuit to reach the second electric charge and receives an electric charge equal to the discharged electric charge as supplement from the loop filter circuit to transmit the first component to the loop filter circuit. Further, the sampling circuit discharges an electric charge to the charge pump circuit to reach the second electric charge and receives an electric charge equal to the discharged electric charge as supplement from the loop filter circuit while holding the control voltage at a constant level, thereby canceling the second component of a down signal. Hence, according to the present invention, a function to transmit the first component of a down signal can be separated from a function to cancel the second component of the down signal, thereby enabling setting of longer processing times for the respective components. As a result, a low level of jitter even in a reproduction clock of a high frequency can be realized.

The recovery circuit preferably includes a plurality of sampling circuits connected in parallel between the charge pump circuit and the loop filter circuit.

An operation to transmit the first component of a down signal to the loop filter circuit and an operation to cancel the second component of the down signal are shared by a plurality of sampling circuits. Hence, according to the present invention, one operation can be performed by a plurality of the sampling circuits; therefore a longer processing time can be set for the one operation. As a result, a low jitter reproduction clock can be generated even in a case of a frequency multiplied by the number of sampling circuits.

The sampling circuit preferably includes: a capacitance element performing sampling of and holding the second electric charge discharged from the charge pump; a first switch controlled by a transmission signal; a second switch controlled by a reset signal; and an analog buffer equalizing the capacitance element to the control voltage.

The capacitance element performs sampling of and holds the second electric charge released from the charge pump circuit. When a transmission signal is inputted, then the first switch is turned on to transmit the second electric charge to the loop circuit, while when a reset signal is inputted, then the second switch is turned on and an electric charge is supplied from the analog buffer to cancel the second electric charge. Hence, according to the present invention, a sampling circuit can be easily realized using a capacitance element.

The control voltage adjusting circuit of the recovery circuit preferably cancels the second component of a down signal in a digital signal processing. The control voltage adjusting circuit cancels the second component inputted from the phase comparator circuit in a digital processing. Hence according to the present invention, the second component can be canceled at high speed.

It is preferable that the voltage controlled oscillator of the recovery circuit further generates a plurality of clocks with different phases, and the control voltage adjusting circuit includes: an output node supplying the control voltage to the voltage controlled oscillator; a sampling circuit receiving the plurality of clocks as inputs, performing sampling of the first and second components of the down signal inputted from the phase comparator circuit according to the plurality of clocks to recover the first component only and output a recovered signal thereof; a charge pump circuit supplying the first electric charge for raising the control voltage to the loop filter circuit based on the up signal from the phase comparator circuit and receiving/supplying the second electric charge for lowering the control voltage from the loop filter circuit based on the reproduction signal from the sampling circuit; and a loop filter circuit raising the control voltage on the output node based on the first electric charge and lowering the control voltage on the output node based on the second electric charge.

The sampling circuit cancels the second component of the down signal inputted from the phase comparator circuit and reproduces only the first component to generate a reproduced signal based on the first and second components of the down signal and a plurality of clocks. The charge pump circuit supplies the first electric charge to the loop filter circuit based on an up signal from the phase comparator circuit and further supplies the second electric charge to the loop filter circuit based on the reproduced signal from the sampling circuit. The loop filter circuit raises or lowers the control voltage based on the first and second electric charges. That is, in a signal processing stage, after the second component is canceled and only the first component is reproduced, supplying/receiving of an electric charge are performed to adjust the control voltage. Hence, according to the present invention, the second component can be canceled without supplying/receiving of an electric charge.

It is preferable that the phase comparator circuit of the recovery circuit further outputs a reset signal and the sampling circuit cancels the second component of the down signal when the reset signal is sampled in succession to sampling of the second component of the down signal according to the plurality of clocks.

When a reset signal is sampled according to the plurality of clocks in succession to sampling of the second component according to the plurality of clocks, the second component is canceled. Therefore, the second component can be canceled according to the presence or absence of a reset signal.

It is preferable that the sampling circuit generates the reproduced signal such that a current is held constant and a time length for which the current is forced to flow is altered according to a width of the first component of the down signal and thereby, the charge pump circuit receives/supplies the second electric charge.

The sampling circuit assigns a weight, associated with a width of the first component of a down signal, to a time length for which a current flows into the charge pump circuit in generating a reproduced signal. Thereby, a current flows into the charge current circuit for a time length determined based on the reproduced signal and thus the charge pump circuit receives/supplies the second electric charge. Hence, according to the present invention, a time length for which a current flows into the loop filter circuit is altered according to a width of the first component of a down signal, thereby enabling supplying/receiving of an electric charge necessary for the first component to be transmitted to the loop filter circuit.

It is preferable that the sampling circuit generates the reproduced signal such that a time length for which a current flows is held at a constant value and a current value is altered according to a width of the first component of the down signal, and thereby the charge pump circuit receives/supplies the second electric charge.

The sampling circuit assigns a weight, associated with a width of the first component of a down signal, to a current value at which a current flows into the charge pump circuit in generating a reproduced signal. A current with a value determined based on the reproduced signal flows into the charge current circuit such that the charge pump circuit receives/supplies the second electric charge. Hence, according to the present invention, a current value at which a current flows into the loop filter circuit is altered according to a width of the first component of a down signal and thereby, enabling supplying/receiving of a electric charge necessary for the first component to be transmitted to the loop filter circuit.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention with reference to the accompanying drawings. It should be noted that in the figures, the same or corresponding constituents are attached with the same reference marks and descriptions thereof are not repeated.

First Embodiment

Figure 1:
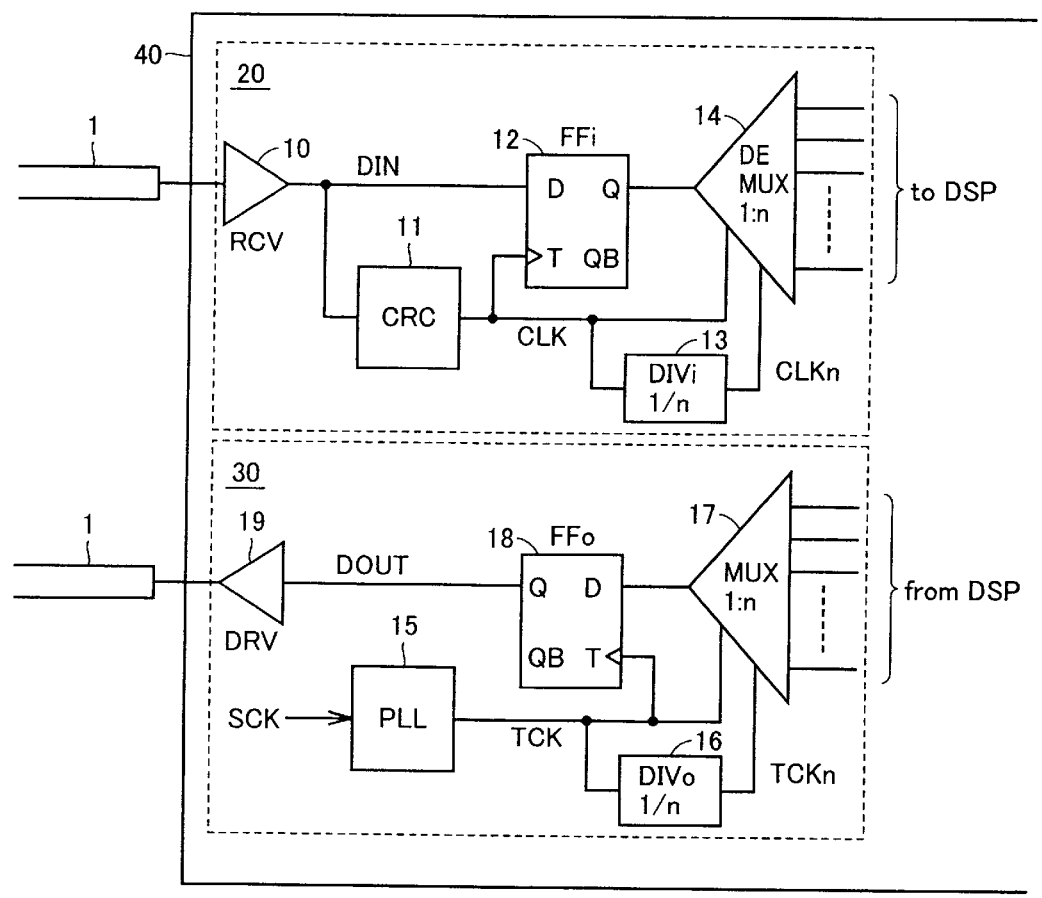
FIG. 1 is a circuit diagram of a transmitting/receiving section of a communication apparatus.

Referring to FIG. 1, description will be given of a communication apparatus 40 employing a recovery circuit according to the present invention. The communication apparatus 40 includes a data receiving section 20 and a data transmitting section 30. The receiving section 20 includes a receiver 10, a recovery circuit 11, an input latch circuit 12, a divide by n circuit 13, and a demultiplexer 14. The receiver 10 receives received data DIN from a communication cable 1 and outputs the received data DIN to the recovery circuit 11 and the input latch circuit 12. The recovery circuit 11 generates a reproduction clock in phase synchronism with the received data DIN by means of a method described later. The input latch circuit 12 latches the received data DIN from the receiver 10 for a prescribed period in synchronism with the rising edge of the reproduction clock CLK from the recovery circuit 11 and outputs the latched received data DIN to the demultiplexer 14. The demultiplexer 14 converts the received data DIN into parallel data of n bits in synchronism with a clock CLKn obtained by frequency-multiplying the reproduction clock CLK by the divide by n circuit 13 into clocks of one cycle 1/n times that thereof and outputs the parallel data of n bits to DSP. (Digital Signal Processor)

The transmitting section 30 includes: a PLL circuit 15 a divide by n circuit 16, a multiplexer 17, an output latch circuit 18 and a driver 19. The PLL circuit 15 generates a transmission clock TCK in synchronism with a system clock SCK. The multiplexer 17 multiplexes parallel data of n bits from DSP and data of one bit together to supply an output thereof to the latch circuit 18. The output latch circuit 18 latches the data multiplexed with one bit from the multiplexer 17 in synchronism with a transmission clock TCK to output the multiplexed data to the driver 19. The driver 19 transmits data through the communication cable 1.

Hence, a recovery circuit 11 according to the present invention is adopted for use in the receiving section 20 of the communication apparatus 40, converts received data DIN into parallel data of n bits and generates a reproduction clock CLK serving as a reference in transmitting of the received data DIN to DSP performing processing of the received data DIN.

Figure 2:
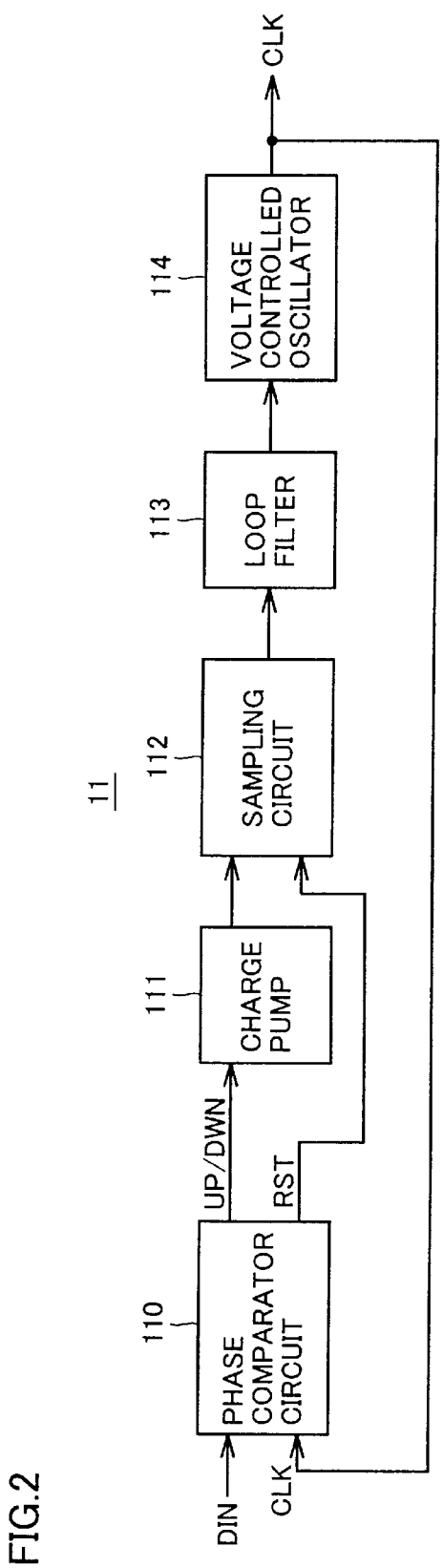
FIG. 2 is a simplified block diagram of a recovery circuit according to a first embodiment.

Referring to FIG. 2, a recovery circuit 11 according to the present invention includes a phase comparator circuit 110, a charge pump 111, a sampling circuit 112, a loop filter 113, and a voltage controlled oscillator 114. The phase comparator circuit 110 compares a phase of a reproduction clock CLK with a phase of received data DIN to output an up signal UP, a down signal DWN and a reset signal RST as described later. The charge pump 111 outputs, in response to an up signal UP or a down signal DWN from the phase comparator circuit 110, an electric charge, to the sampling circuit 112, for adjusting a control voltage outputted to the voltage controlled oscillator 114, as described later.

The sampling circuit 112 supplies an electric charge outputted from the charge pump 111 based on an up signal to the loop filter circuit 113 by means of a method described later, as it is, holds an electric charge outputted from the charge pump 111 in response to a down signal detected at an edge of received data DIN to supply the holding electric charge to the loop filter 113. Further, when the phase comparator circuit 110 detects no edge of received data DIN in a period in which a reproduction clock CLK is at a level of L (logical low), the sampling circuit 112 cancels an down signal inputted from the phase comparator circuit 110.

The loop filter 113 adjusts the control voltage with a supplied electric charge to supply the adjusted control voltage to the voltage controlled oscillator 114. The voltage control oscillator 114 generates a reproduction clock CLK whose phase is converted by the control voltage from the loop filter 113 to output the generated reproduction clock CLK to the phase comparator circuit 110.

Figure 3:
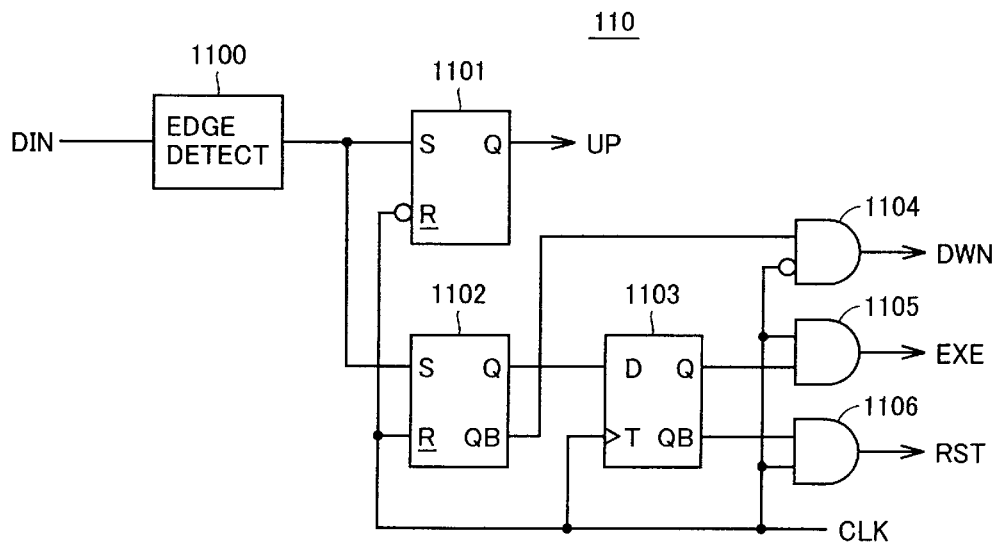
FIG. 3 is a circuit diagram of a phase comparator circuit of the recovery circuit shown in FIG. 2.

Referring to FIG. 3, the phase comparator circuit 110 includes an edge detecting circuit 100, RS latch circuits 1101 and 1102, a flip-flop 1103, and AND gates 1104 to 1106. The edge detecting circuit 1100 is inputted with received data DIN to detect an edge of the received data DIN by means of a method described later and output an edge detection signal EDG. The RS latch circuit 1101 is a reset priority latch circuit and outputs an up signal having latched an edge detection signal EDG from the edge detecting circuit 1100. The RS latch circuit 1101 is reset by an inverted clock/CLK obtained by inverting a reproduction clock CLK. The RS latch circuit 1102 is a reset priority latch circuit and outputs a set output signal having latched an edge detection signal EDG from the edge detecting circuit 1100 to the flip-flop 1103 and further outputs a reset output signal to the AND gate 1104. The RS latch circuit 1102 is reset by a reproduction clock CLK. The flip-flop 1103 outputs an output signal obtained by delaying a set output signal of the RS latch circuit 1102 by one cycle of the reproduction clock CLK to the AND gate 1105 and further outputs an inverted output signal to the AND gate 1106.

The AND gate 1104 generates a logical product of a set output signal of the RS latch circuit 1102 and an inverted clock/CLK of a reproduction clock CLK to output a down signal DWN. The AND gate 1105 generates a logical product of an output signal of the flip-flop 1103 and a reproduction clock CLK to output a transmission signal EXE. The AND gate 1106 generates a logical product of an inverted output signal of the flip-flop 1103 and a reproduction clock CLK to output a reset signal RST.

Figure 4:
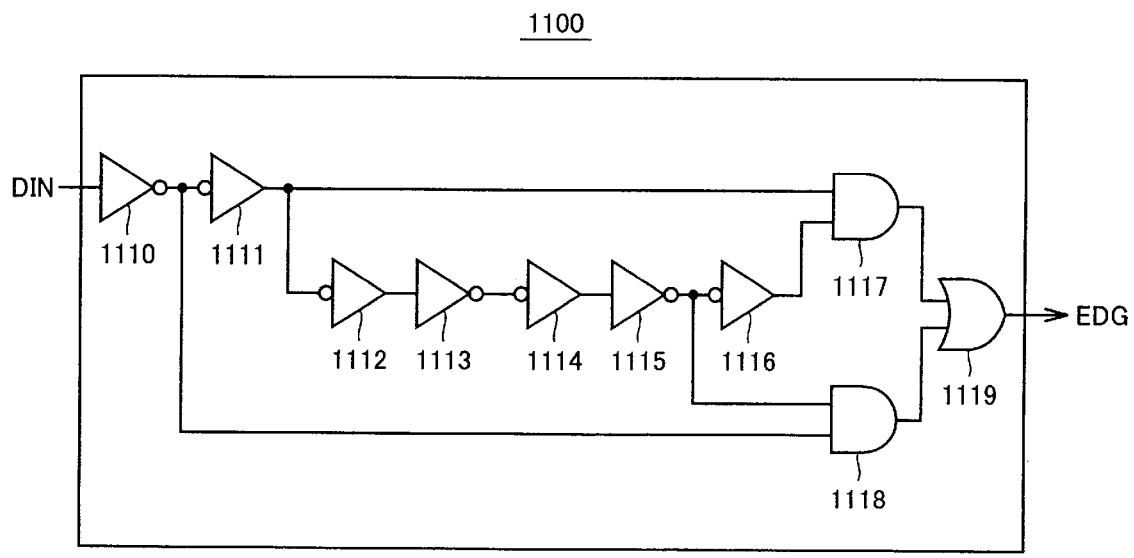
FIG. 4 is circuit diagram of an edge detecting circuit of the phase comparator circuit shown in FIG. 3.

Referring to FIG. 4, the edge detecting circuit 1100 includes: inverters 1110 to 1116; AND gates 1117 and 1118; and an OR gate 1119. The AND gate 1117 generates a logical product of outputs of the inverter 1111 and the inverter 1116 to output a logical product to one of the terminals of OR gate 1119. The AND gate 1118 generates a logical product of output signals of the inverter 1110 and the inverter 1115 to output a logical product to the other of the input terminals of the OR gate 1119.

Figure 5:
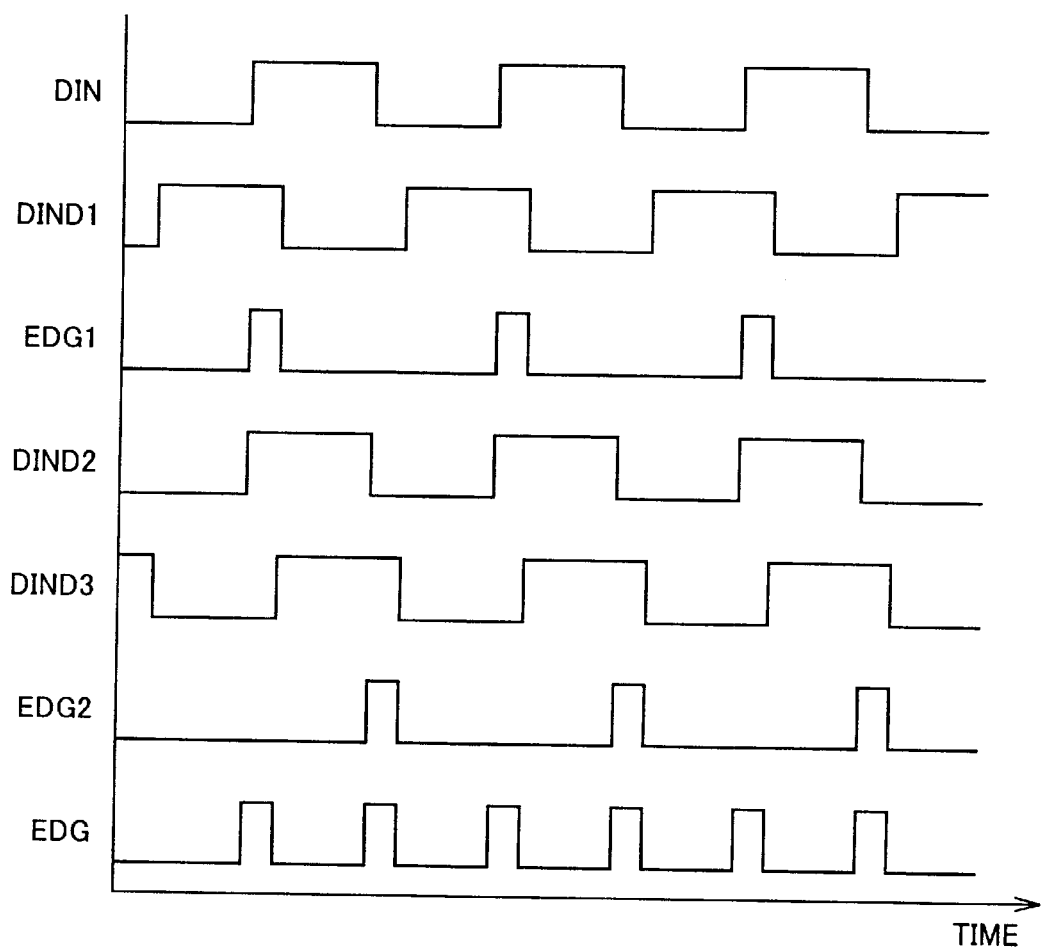
FIG. 5 is a timing chart of signals in the edge detecting circuit shown in FIG. 4.

Referring to FIG. 5, the inverter 1110 outputs a signal DIND3 obtained by inverting and delaying received data DIN to the inverter 1111 and the AND gate 1118. The inverter 1111 outputs a signal DIN obtained by inverting and delaying the signal DIND3 to the AND gate 1117 and the inverter 1112. Since the inverter 1111 outputs a signal obtained by inverting the received data DIN twice, an output signal of the inverter 1111 is expressed as the same signal DIN as the received data DIN in FIG. 5. The inverters 1112 to 1116 outputs a signal DIND1 obtained by inverting the signal DIN five times to result in a delay to the AND gate 1117. Further, the inverters 1112 to 1115 outputs a signal DIND2 obtained by inverting the signal DIN four times to result in a delay to the AND gate 1118.

The AND gate 1117 generates a logical product of the signals DIN and DIND1 to output an edge signal EDG1 to one of the terminals of the OR gate 1119. The AND gate 1118 generates a logical product of the signals DIND2 and DIND3 to output an edge signal EDG2 to the other of the terminals of the OR gate 1119. By doing so, the OR gate 1119 generates a logical sum of the edge signals EDG1 and EDG2 to output an edge detection signal EDG.

Figure 6A:
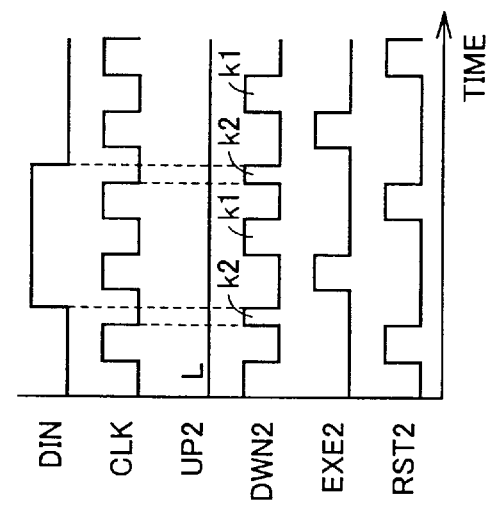
FIG. 6A is a timing chart of signals outputted from the phase comparator circuit shown in FIG. 3 when a phase of a reproduction clock coincides with a phase of received data.
Figure 6B:
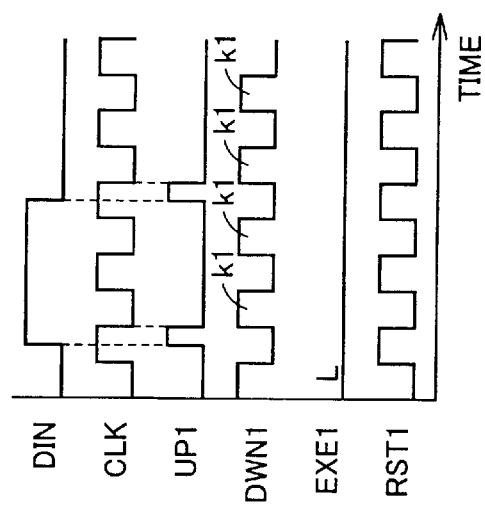
FIG. 6B is a timing chart of signals outputted from the phase comparator circuit shown in FIG. 3 when a reproduction clock is delayed as compared to received data in phase.

Referring to FIGS. 3 and 6A to 6C, the edge detecting circuit 1100 outputs an edge detection signal EDG by means of the method described referring to FIGS. 4 and 5. Referring to FIG. 6B, when a reproduction clock CLK is delayed to received data DIN in phase, the RS latch circuit 1101 latches an edge detection signal EDG synchronized with an inverted clock signal/CLK of the recovered lock CLK as a reset signal to output an up signal UP1. That is, the UP1 signal is outputted as a signal having a width corresponding to a difference between an edge of received data DIN and the falling edge of the reproduction clock CLK in a period in which the reproduction clock CLK is at H (logical high) level. The RS latch circuit 1102 latches an edge detection signal EDG synchronized with a reproduction clock CLK as a reset signal to output a set output signal to the flip-flop 1103 and further outputs a reset signal to the AND gate 1104.

In this situation, the AND gate 1104 generates a logical product of the reset output signal of the RS latch circuit 1102 and an inverted clock/CLK of the reproduction clock CLK to output a down signal DWN1. In this case, the down signal DWN1 is outputted in a period in which the reproduction clock CLK is at L level, bears no relation to an edge of the received data DIN and is constituted of a component k1 having a width of a half cycle of the reproduction clock CLK. Further, the flip-flop 1103 outputs an output signal obtained by delaying a set signal of the RS latch circuit 1102 by one cycle of the reproduction clock CLK and outputs an inverted output signal to the AND gate 1106. The AND gate 1106, then, generates a logical product of an output signal of the flip-flop 1103 and a reproduction clock CLK to output a transmission signal EXE1. In this case, a down signal DWN1 includes no signal component related to an edge of received data DIN; therefore, the transmission signal EXE is at L level. Further, the AND gate 1106 generates a logical product of an inverted output signal of the flip-flop 1103 and a reproduction clock CLK to output a reset signal RST1.

Figure 6C:
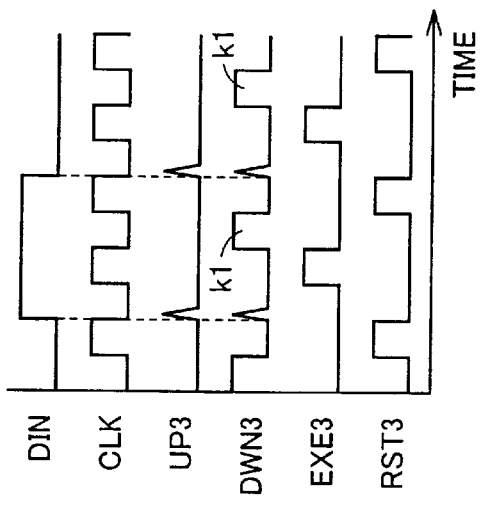
FIG. 6C is a timing chart of signals outputted from the phase comparator circuit shown in FIG. 3 when a reproduction clock leads received data in phase.

Referring to FIG. 6C, when a reproduction clock CLK leads received data DIN in phase, an edge detection signal EDG stays in a period in which the reproduction clock is at L level; therefore, the RS latch circuit 1101 outputs an up signal UP2 of L level. Further, the AND gate 1104 outputs a down signal DWN composed of a component k1 having a width of a half cycle of the reproduction clock CLK and a component k2 having a width corresponding to a difference between the falling edge of the reproduction clock CLK and an edge of the received data DIN in a period in which the reproduction clock CLK is at L level. The AND gate 1105 outputs a transmission signal EXE2 in a period in which the reproduction clock CLK is at H level. The transmission signal EXE2 is detected in a period of H level next to a period of the reproduction clock in which the component k2 of the down signal DWN2 is detected. Further, the AND gate 1106 outputs a reset signal RST2 in a period in which the reproduction clock CLK is at L level. The reset signal RST2 is detected in a period of H level next to a period of the reproduction clock CLK in which the component k1 of the down signal DWN2 is detected.

Further, with reference to FIG. 6A, when a phase of a reproduction clock CLK coincides with a phase of received data DIN, that is when a reproduction clock CLK and received data DIN are in a phase lock state, the RS latch circuit 1101 outputs an up signal UP3 in a period in which the reproduction clock CLK is at H level. When a reproduction clock CLK and received data DIN are in a phase lock state, an up signal UP essentially includes no signal component related to an edge of the received data DIN. However, since a case is considered in which a phase of the received data DIN is deviated from a phase of the received data DIN at some extent, an up signal UP including a spike-like signal component is shown in FIG. 6A. Further, the AND gate 1104 outputs a down signal DWN3 in a period in which the reproduction clock is at L level. The down signal DWN3 is composed of a component k1 having a width of a half cycle of the reproduction clock CLK, and bearing no relation to an edge of the received data DIN and a spike-like component. In this case as well, while a down signal DWN essentially includes no signal component related to an edge of received data DIN, shown is the down signal including a spike-like component for a similar reason of that in the case of an up signal UP. The AND gate 1105 outputs a transmission signal EXE3 in a period in which a reproduction clock CLK is at H level. The transmission signal EXE3 is detected in a period of H level next to a period of the reproduction clock CLK in which a spike-like component of a down signal DWN3 is detected. Further, the AND gate 1106 outputs a reset signal RST3 in a period in which the reproduction clock CLK is at L level. The reset signal RST3 is detected in a period of H level next to a period of the reproduction clock CLK in which the component k1 of a down signal DWN3 is detected.

According the operations as described above, the phase comparator circuit 110 outputs the up signals UP1 to UP3, the down signals DWN1 to DWN3, the transmission signals EXE1 to EXE3 and the reset signals RST1 to RST3 according to a difference between a phase of a reproduction clock CLK and a phase of received data DIN.

Figure 7:
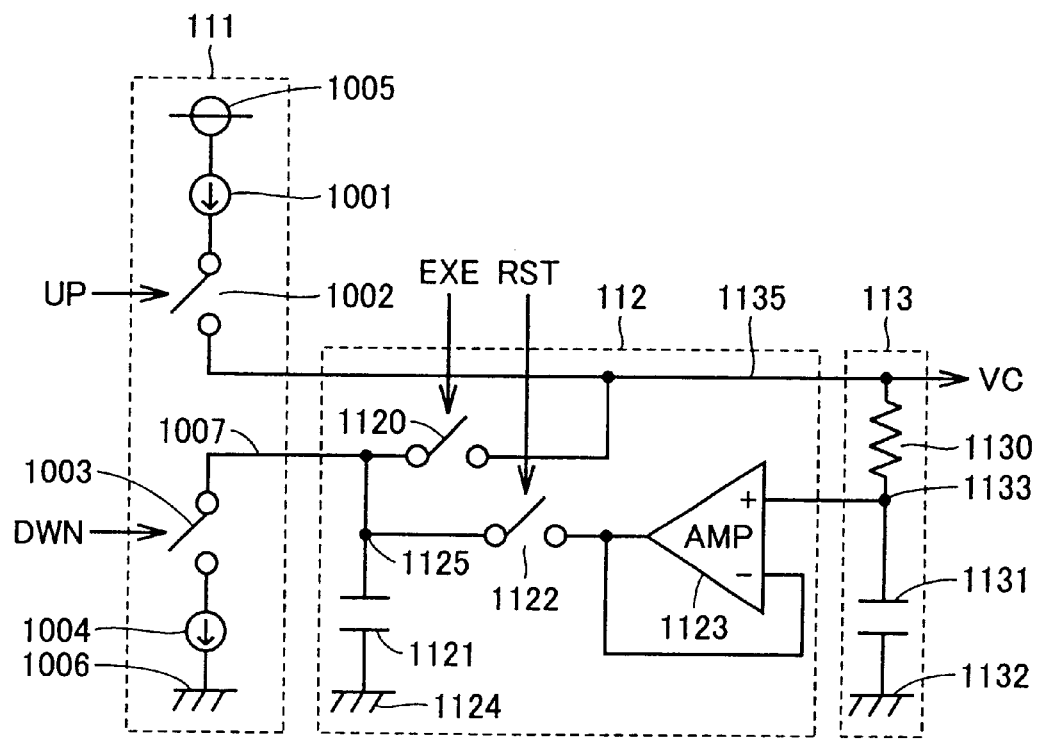
FIG. 7 is a circuit diagram of a charge pump circuit and a sampling circuit of the recovery circuit shown in FIG. 2.

Referring to FIG. 7, the charge pump 111 includes current sources 1001 and 1004 switches 1002 and 1003. The current source 1001 and the switch 1002 are connected in series between a power supply node 1005 and an output node 1135. Further, the switch 1002 is turned on or off by an up signal UP from the phase comparator circuit 110. The switch 1003 and the current source 1004 are connected in series between a ground node 1006 and an output node 1007. Further, the switch 1003 is turned on or off by a down signal DWN from the phase comparator circuit 110. The switch 1002 is turned on when an up signal UP from the phase comparator circuit 110 is inputted and the current source 1001 in the charge pump 111 supplies a current (an electric charge) to the output node 1135. Further, when the charge pump 111 is inputted with a down signal DWN from the phase comparator circuit 110, the switch 1003 is turned on and thereby a current (an electric charge) is supplied to a ground node 1006 from an output node 1007 by the current source 1004.

The sampling circuit 112 includes switches 1120 and 1122 a capacitor 1121, an amplifier 1123. The switch 1120 is disposed between the output node 1007 and the output node 1135 and is turned on or off by a transmission signal EXE from the phase comparator circuit 110. The capacitor 1121 is disposed between the output node 1107 and a ground node 1124. The capacitor 1121 is charged when the switch 1122 is turned on, while the capacitor 1121 is discharged when the switch 1003 or 1120 is turned on. The switch 1122 is disposed between a node 1125 and the amplifier 1123 and turned on or off by a reset signal RST from the phase comparator circuit 110. The amplifier 1123 is disposed between the switch 1122 and a contact point 1133. The amplifier 1123 amplifies a voltage at the contact point 1133 to charge the capacitor 1121.

The loop filter 113 includes a resistor 1130 and a capacitor 1131. The resistor 1130 and the capacitor 1131 are connected in series between the output node 1135 and a ground node 1132. When the switch 1002 is turned on, the capacitor 1131 is charged. Further, when the switch 1120 turned on, the capacitor 1131 is discharged. The output node 1135 supplies a control voltage VC to the voltage controlled oscillator 114.

When an up signal UP at H level is inputted from the phase comparator circuit 110, the switch 1002 is turned on and the current source 1001 supplies a current (a electric charge) to the output node 1135. With the supply of a current, the capacitor 1131 of the loop filter 113 is charged by an electric charge corresponding to a pulse width of the up signal UP to raise a voltage level of the control voltage VC on the output node 1135. Further, when a down signal DWN at H level is inputted from the phase comparator circuit 110, the switch 1003 is turned on and the capacitor 1121 is discharged to a ground node 1006 through the current source 1004. By discharge of the capacitor 1121, the down signal DWN is sampled to the sampling circuit 112. When a transmission signal EXE at H level is inputted from the phase comparator circuit 110, the switch 1120 is turned on and the capacitor 1121 is thereby charged; therefore, a potential of the output node 1135 and a voltage level of the control voltage VC fall. In this case, the capacitor 1121 of the sampling circuit 112 discharges an electric charge to the charge pump 111 to reduce an amount of the accumulated electric charge and a down signal DWN is held by the reduced electric charge. Accordingly, the charge pump 111 supplies an electric charge for holding the down signal DWN to the sampling circuit 112. Likewise, the capacitor 1121 of the sampling circuit 112 receives an electric charge in amount equal to an electric charge discharged to the charge pump 111 from the capacitor 1131 of the loop filter 113 and thereby, an electric charge of the capacitor 1131 of the loop filter 113 decreases and a voltage level of the control voltage VC is lowered by the reduced electric charge. Accordingly, the sampling circuit 112 supplies an electric charge lowering a voltage level of the control voltage VC to the loof filter 113.

Further, when a reset signal RST of H level is inputted from the phase comparator circuit 110 after a down signal DWN is sampled to the sampling circuit 112 by discharge of the capacitor 1121 caused by turn-on of the switch 1003, the switch 1122 is turned on and the capacitor 1121 is charged by the amplifier 1123. As a result, the sampled down signal DWN is canceled. In this case, the capacitor 1121 of the sampling circuit 112 discharges to supply an electric charge to the charge pump 111 and reduce an amount of the accumulated electric charge thereof. The down signal DWN is held by the reduced electric charge. Accordingly, the charge pump 111 supplies an electric charge for holding the down signal DWN to the sampling circuit 112.

A transmission signal EXE is, as shown in FIG. 6C, outputted to the sampling circuit 112 in a period of H level next to a period of a reproduction clock CLK in which the signal component k2 of a down signal DWN is detected. Hence, the signal component k2 expressing a phase difference between a reproduction clock CLK and an edge of received data DIN forces the switch 1003 to be turned on and discharge the capacitor 1121; therefore, the signal component k2 is once sampled to the sampling circuit 112. Thereafter, the switch 1120 is turned on by the transmission signal EXE to charge the capacitor 1121 with an electric charge accumulated in the capacitor 1131 and lower a potential of the output node 1135, and thereby the sampled signal component k2 is transmitted to the output node 1135, with the result that a voltage level of the control voltage VC falls.

Further, a reset signal RST is, as shown in FIG. 6C, is outputted to the sampling circuit 112 in a period of H level next to a period of a reproduction clock CLK in which the signal component k1 of a down signal DWN is detected. Hence, the signal component k1 bearing no relation to a phase difference between a reproduction clock CLK and received data DIN forces the capacitor 1121 to discharge through turn-on of the switch 1003; therefore, the signal component k1 is once sampled to the sampling circuit 112. Thereafter, the switch 1122 is turned on by a reset signal RST and the capacitor 1121 is charged by the amplifier 1123 and thereby, the sampled signal component k1 is canceled, wherein a voltage level of the control voltage VC has no change.

That is, when an up signal UP based on an edge of received data DIN or a down signal DWN (a signal component k2) based on an edge of received data DIN is inputted, the sampling circuit 112 transmits the up signal UP or the down signal DWN to the loop filter circuit 113, while when a down signal DWN (a signal component k1) bearing no relation to an edge of received data DIN is inputted, the down signal DWN is canceled. Accordingly, when a phase of a reproduction clock CLK coincides with a phase of received data DIN, the sampling circuit 112 cancels a down signal even if the down signal composed of the signal component k1 is inputted from the phase comparator circuit 110, therefore, there is no chance that, when the signal component k1 is inputted, the capacitor 1131 is discharged to lower a voltage level of the control voltage VC. That is, when a reproduction clock CLK and received data DIN in a phase lock state, the control voltage VC outputted from the loop filter circuit 113 is held at a constant level.

As described above, the charge pump circuit 111, the sampling circuit 112 and the loop filter 113 adjusts a voltage level of the control voltage VC based on a comparison result in the phase comparator circuit 110. Hence, the charge pump circuit 111, the sampling circuit 112 and the loop filter 113 constitutes a control voltage adjusting circuit. The control voltage adjusting circuit raises a voltage level of the control voltage VC based on an up signal UP from the phase comparator circuit 110 such that an optimal control voltage is achieved at which a phase of a reproduction clock CLK coincides with a phase of received data DIN. Further, the control voltage adjusting circuit lowers a voltage level of the control voltage VC based on a signal component k2 of a down signal DWN from the phase comparator circuit 110 such that an optimal control voltage is achieved at which a phase of a reproduction clock CLK coincides with a phase of received data DIN.

Figure 8:
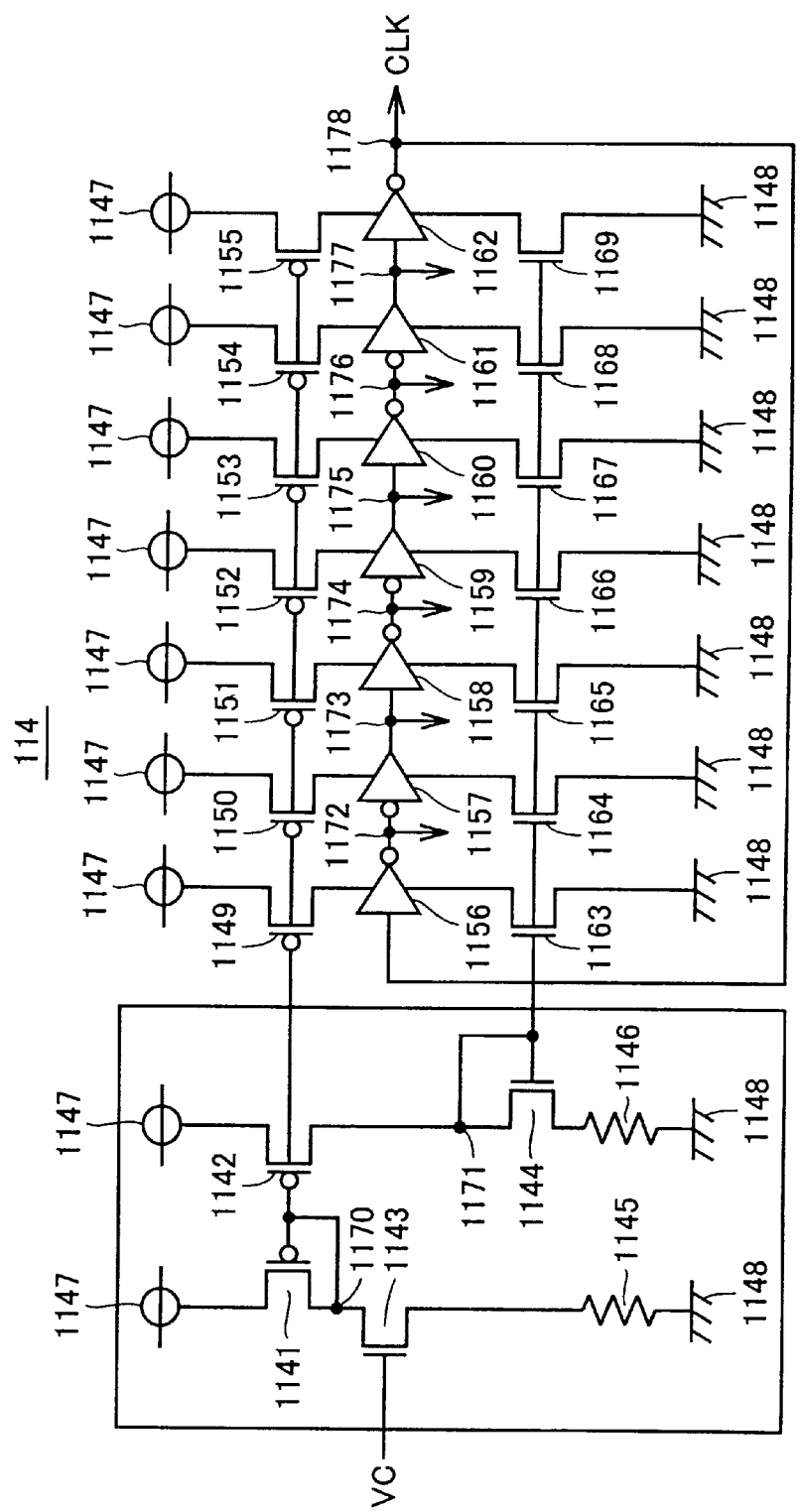
FIG. 8 is a circuit diagram of a voltage controlled oscillator in the recovery circuit shown in FIG. 2.

Referring to FIG. 8, the voltage controlled oscillator 114 includes P channel MOS transistors 1141, 1142, 1149 to 1155; N channel MOS transistors 1143, 1144, 1163 to 1169, resistors 1145 and 1146, and inverters 1156 to 1162. The p channel transistor 1141, the N channel MOS transistor 1143 and the resistor 1145 are connected in series between a power supply node 1147 and a ground node 1148. The N channel MOS transistor 1143 receives a control voltage VC from the loop filter 113 at the gate terminal thereof. Further, the P channel MOS transistor 1142, the N channel MOS transistor 1144 and the resistor 1146 are connected in series between the power supply node 1147 and the ground node 1148. The N channel MOS transistor 1144 is connected in diode connection.

Sets of the P channel MOS transistors 1149 to 1155, the inverters 1156 to 1162, and the N channel MOS transistors 1163 and 1169 constitute a ring oscillator. In FIG. 8, shown is a 7 stage ring oscillator. Sets of the P channel MOS transistor 1149, the inverter 1156 and the N channel MOS transistor 1163; the P channel MOS transistor 1150, the inverter 1157 and the N channel MOS transistor 1164; the P channel MOS transistor 1151, the inverter 1158 and the N channel MOS transistor 1165; the P channel MOS transistor 1152, the inverter 1159 and the N channel MOS transistor 1166; the P channel MOS transistor 1153, the inverter 1160 and the N channel MOS transistor 1167; the P channel MOS transistor 1154, the inverter 1161 and the N channel MOS transistor 1168; and the P channel MOS transistor 1155, the inverter 1159 and the N channel MOS transistor 1169; each set of which are connected in series between the power supply node 1147 and the ground node 1148, constitutes respective stages of the 7 stage ring oscillators.

A value of a current flowing into the ground node 1148 through the P channel MOS transistor 1141, the N channel MOS transistor 1143 and the resistor 1145 from the power supply node 1147, and a voltage level on a node 1170, too, differ according to a voltage level of the control voltage VC applied to the gate terminal of the N channel MOS transistor 1143. Since the voltage on the node 1170 is applied to the gate terminal of the P channel MOS transistor 1142, the voltage on the node 1170 controls a value of a current flowing into the ground node 1148 through the P channel MOS transistor 1142, the N channel MOS transistor 1144 and the resistor 1146 from the power supply node 1147. As a result, a voltage level on the node 1171 differs according to a voltage level on the node 1170.

A voltage on the node 1170 is also applied to the gate terminals of the P channel MOS transistors 1149 to 1155 of the 7 stage ring oscillator. Further, A voltage on the node 1171 is applied to the gate terminals of the N channel MOS transistors 1163 to 1169 of the 7 stage ring oscillator. Moreover, a reproduction clock CLK outputted from the inverter at the 7th stage is fed back to the inverter at the first stage. Accordingly, when a voltage level of the control voltage VC is altered, voltages on the nodes 1170 and 1171 alter and according to voltage levels thereof, a delay time of each stage of the 7 stage ring oscillator alters to generate a reproduction clocks CLK with a different phase. Further, reproduction clocks CLK0 to CLK6 with different phases are generated from the respective nodes 1172 to 1178.

Referring to FIGS. 6 to 8, when a reproduction clock CLK leads received data DIN in phase, the sampling circuit 112 transmits the signal component k2 of a down signal DWN inputted from the phase comparator circuit 110 to the loop filter 113 and the loop filter 113 outputs a control voltage VC of a lower voltage level. In this case, the signal component k1 of the down signal DWN is canceled. In such a situation, potential levels on the nodes 1170 and 1171 of the voltage controlled oscillator 114 fall and a high voltage is applied onto each of the inverters 1156 to 1162. Then, the voltage controlled oscillator 114 generates a reproduction clock CLK with a largely delayed phase. Thereby, a phase of a reproduction clock CLK is gradually delayed to finally coincide with a phase of received data DIN.

Further, when a reproduction clock CLK is delayed as compared to received data DIN in phase, (see FIG. 6B), the sampling circuit 112 transmits an up signal UP from the phase comparator circuit 110 to the loop filter 113 and the loop filter 113 outputs a control voltage VC having a raised level. In this case, the sampling circuit 112 cancels a signal component k1 of a down signal DWN inputted from the phase comparator circuit 110. With such a cancellation, potentials on the nodes 1170 and 1171 of the voltage controlled oscillator 114 rise to apply a low voltage to each of the inverters 1156 to 1162. In this situation, the voltage controlled oscillator 114 generates a reproduction clock CLK having a slightly delayed phase. Thereby, a phase of the reproduction clock CLK is gradually advanced to finally coincide with a phase of the received data DIN.

Further, when a reproduction clock CLK and received data DIN are in a phase lock state (see FIG. 6A), the sampling circuit 112 transmits a spike-like signal component of an up signal UP and a spike-like signal component of a down signal DWN from the phase comparator circuit 110 to the loop filter 113 and cancels the signal component k1 of the down signal DWN. The switch 1002 of the charge pump 111 is turned on in a very short time by the spike-like signal component of the up signal UP and a small current flows to the output node 1135, but almost no change occurs in the control voltage VC. Likewise, the switch 1004 of the charge pump 111 is turned on in a very short time by a spike-like signal component of a down signal DWN and the capacitor 1121 is discharged in a very short time. However, since an amount of discharged electricity in the capacitor 1121 is small, almost no change occurs in potential on the node 1135. As a result, even if the switch 1120 is turned on by a transmission signal EXE, almost no change occurs in the control voltage VC. Further, the sampling circuit 112, as described above, cancels the signal component k1 of a down signal DWN; therefore, the control voltage VC is not altered by the signal component k1. Accordingly, when a reproduction clock CLK and received data DIN are in a phase lock state, the loop filter 113 outputs a control voltage VC held at an almost constant level to the voltage controlled oscillator 114. As a result, the voltage controlled oscillator 114 generates a reproduction clock CLK having a constant phase.

According to the first embodiment, the recovery circuit 11 cancels a down signal DWN bearing no relation to an edge of received data DIN; therefore, a low jitter reproduction clock CLK can be generated in a state where the reproduction clock CLK and the received data DIN are in a phase lock state.

Second Embodiment

Figure 9:
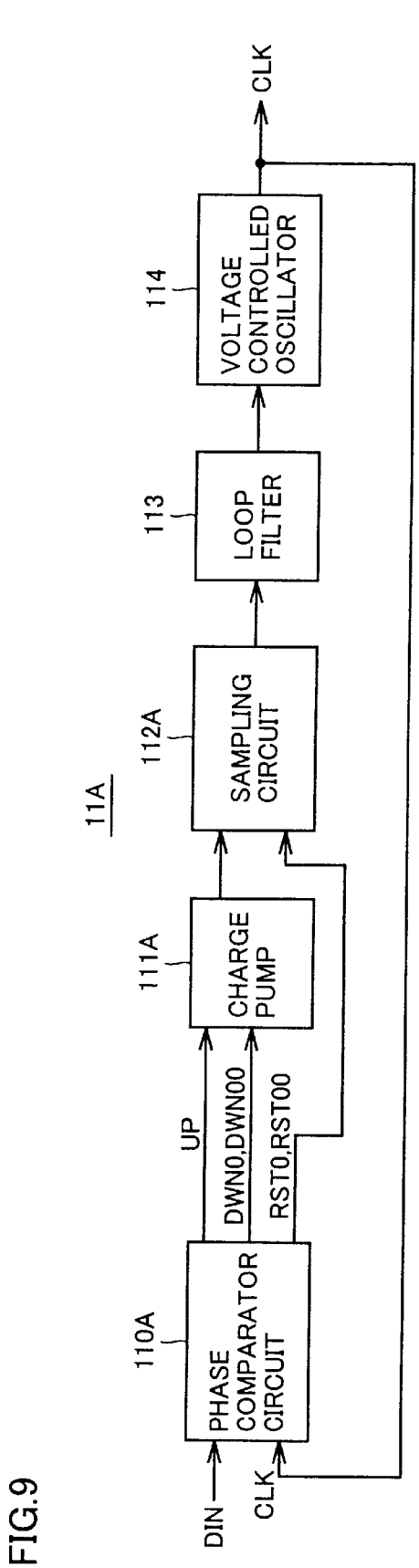
FIG. 9 is a simplified block diagram of a recovery circuit according a second embodiment.

Referring to FIG. 9, a recovery circuit 11A according to the second embodiment is the same as the recovery circuit 11 according to the first embodiment with the exception that in the recovery circuit 11 of the first embodiment, the phase comparator circuit 110, the charge pump 111 and the sampling circuit 112 are replaced with a phase comparator circuit 110A, a charge pump 111A and a sampling circuit 112A, respectively. The other parts of the configuration are the same as corresponding parts of the configuration of the recovery circuit 11 of the first embodiment. The phase comparator circuit 110A outputs an up signal UP and down signals DWN0 and DWN00 to the charge pump 111A and further outputs reset signals RST0 and RT00 to the sampling circuit 112A.

Figure 10:
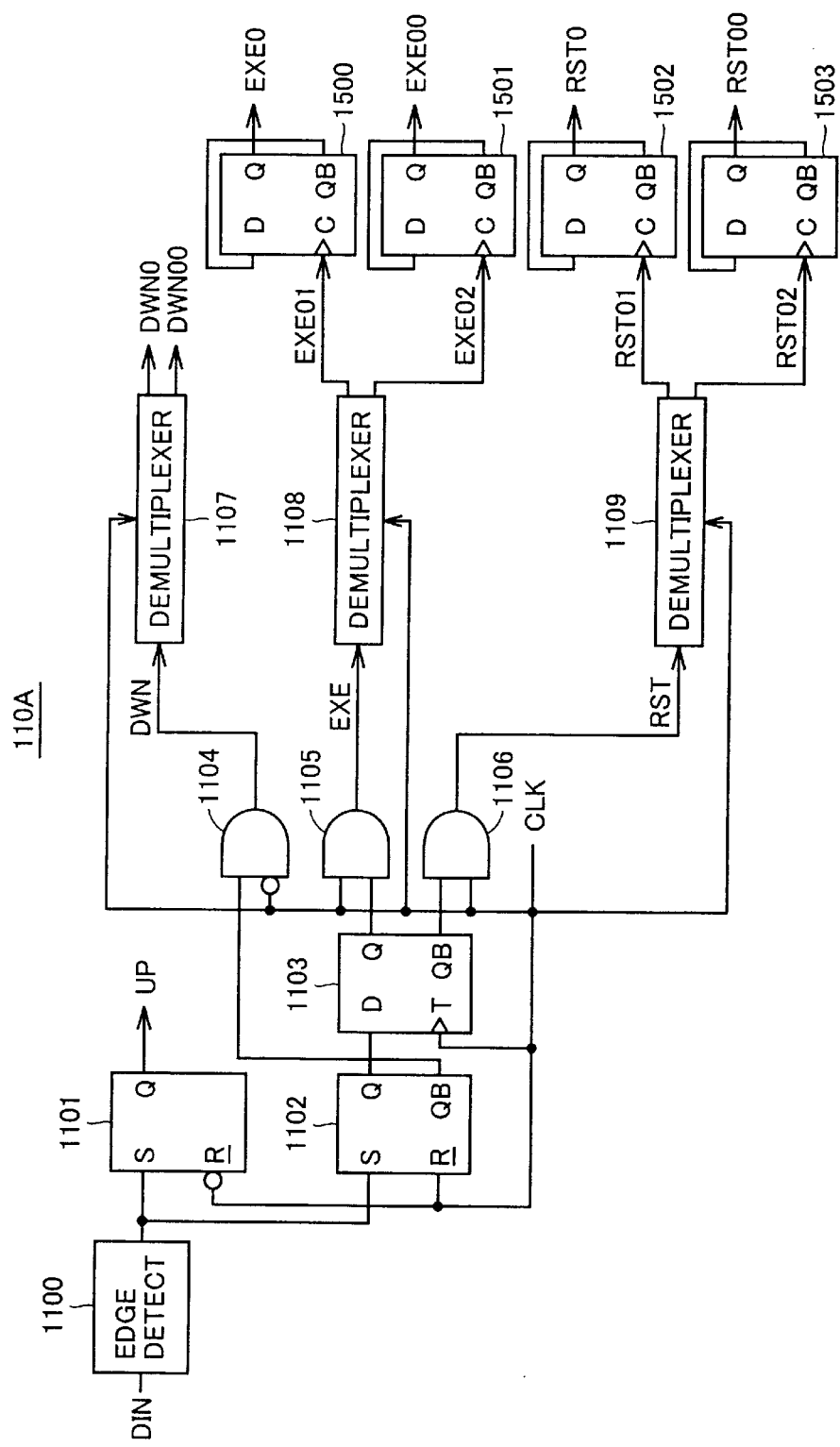
FIG. 10 is a circuit diagram of a phase comparator circuit in the recovery circuit shown in FIG. 9.

Referring to FIG. 10, the phase comparator circuit 110A is configured by adding demultiplexers 1107 to 1109 and flip-flops 1500 to 1503 to the phase comparator circuit 110 and the other parts of the configuration thereof are the same as corresponding parts of the configuration of the phase comparator circuit 110. The demultiplexer 1107 separates a down signal DWN into a down signal DWN0 and DWN00 synchronized with a reproduction clock CLK. The demultiplexer 1108 separates a transmission signal EXE into transmission signals EXE01 and EXE02 synchronized with a reproduction clock CLK. The demultiplexer 1109 separates a reset signal RST into reset signals RST01 and RST02 in synchronized with a reproduction clock CLK.

The flip-flop 1500 outputs a transmission signal EXE0 having a pulse width twice that of a transmission signal EXE01. The flip-flop 1501 outputs a transmission signal EXE00 having a pulse width twice that of a transmission signal EXE02. The flip-flop 1502 outputs a reset signal RST0 having a pulse width twice that of a reset signal RST01. The flip-flop 1503 outputs a reset signal RST00 having a pulse width twice that of a reset signal RST02.

Figure 11:
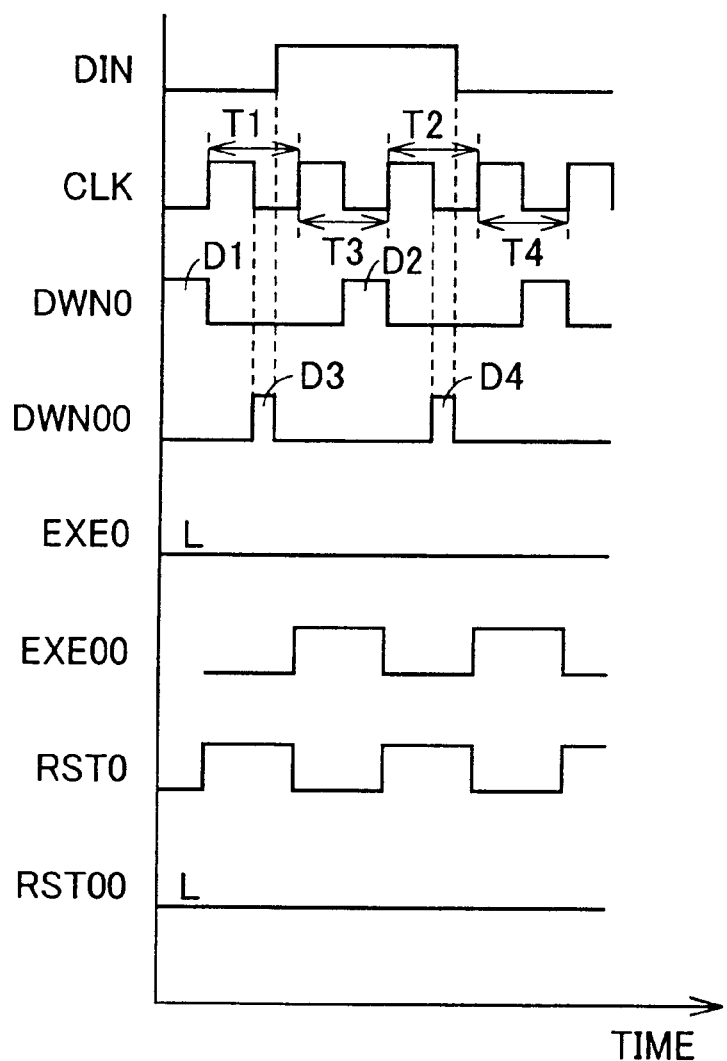
FIG. 11 is a timing chart of signals outputted from the phase comparator circuit shown in FIG. 10.

Referring to FIG. 11, description will be given of generation of the down signals DWN0 and DWN00, the transmission signals EXE0 and EXE00, and the reset signals RST0 and RST00 when a reproduction clock CLK leads received data DIN in phase. FIG. 11 is a timing chart corresponding to the timing chart of FIG. 6C in the first embodiment. When the AND gate 1104 outputs a down signal DWN corresponding to the down signal DWN2 shown in FIG. 6C, the demultiplexer 1107 outputs down signals DWN0 and DWN00 obtained by time-dividing a down signal DWN2 in synchronism with the falling edge of the reproduction clock CLK.

Further, when the AND gate 1105 outputs a transmission signal EXE corresponding to the signal EXE2 shown in FIG. 6C, the demultiplexer 1108 outputs a transmission signal EXE01 and a transmission signal EXE02 obtained by time-dividing the transmission signal EXE2 in synchronism with the fall of a reproduction clock CLK. Further when the AND gate 1106 outputs a reset signal RST corresponding to the reset signal RST2 shown in FIG. 6C, the demultiplexer 1109 outputs reset signals RST01 and RST02 obtained by time-dividing the reset signal RST2 in synchronism with the fall of a reproduction clock CLK.

Then, the flip-flop 1500 outputs the transmission signal EXE0 having a pulse width twice that of the transmission signal EXE01. The flip-flop 1501 outputs a transmission signal EXE00 having a pulse width twice that of the transmission signal EXE02.

Further, the flip-flop 1502 outputs a reset signal RST0 having a pulse width twice that of a reset signal RST01. The flip-flop 1503 outputs a reset signal RST00 having a pulse width twice that of a transmission signal RST02.

In FIG. 11, a transmission signal EXE0 and a reset signal RST00 are signals of L level, which originated in timings of time division in the demultiplexers 1108 and 1109.

Note that when a reproduction clock CLK is delayed as compared to received data DIN in phase and when a phase of a reproduction clock CLK coincides with a phase of received data DIN, down signals DWN0 and DWN00, and reset signals RST0 and RST00 are generated at timings similar to the timing chart shown in FIG. 11.

Figure 12:
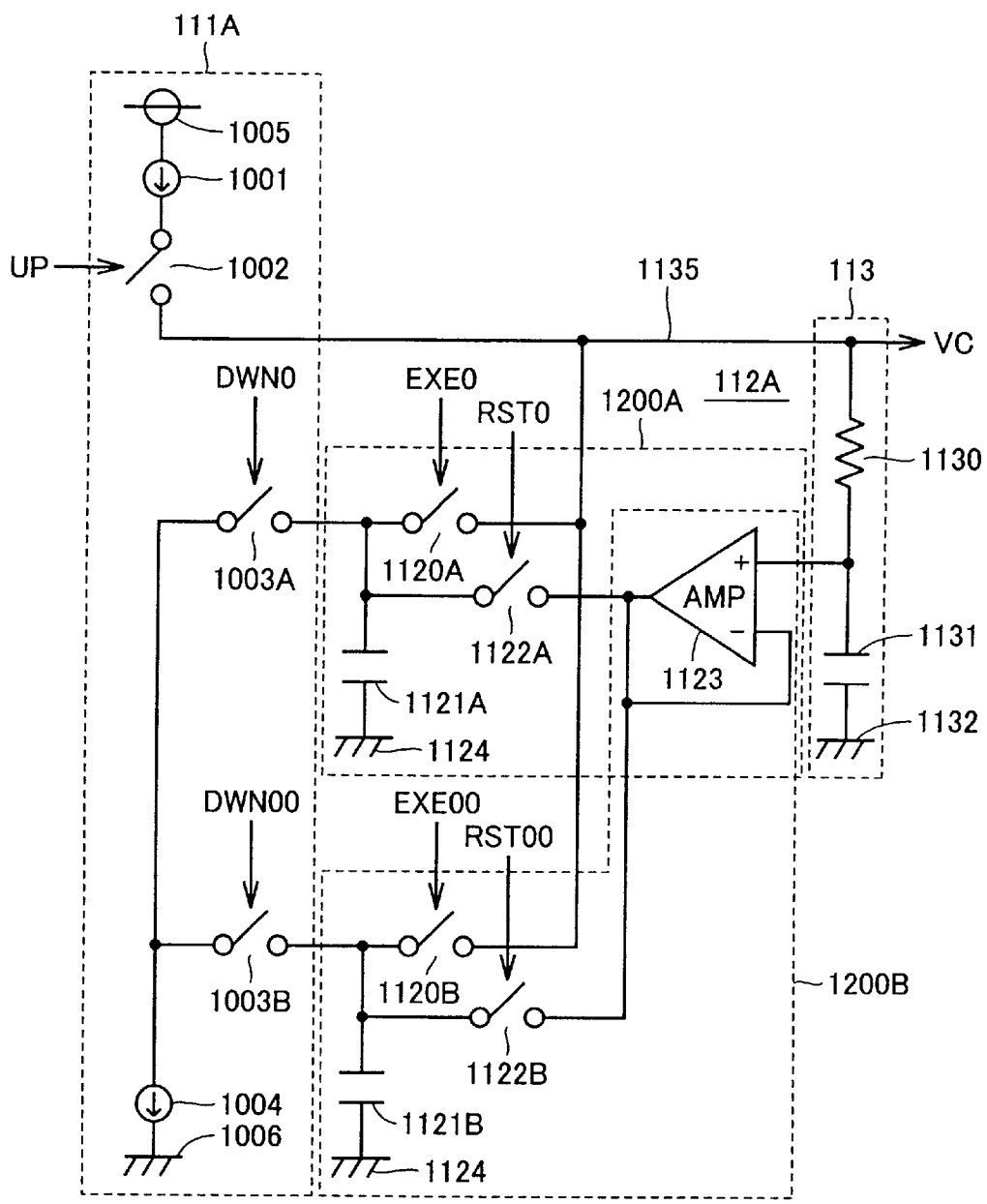
FIG. 12 is a circuit diagram of a charge pump, a sampling circuit and a loop filter in the recovery circuit shown in FIG. 9.

Referring to FIG. 12, the sampling circuit 112A includes sampling circuit 1200A and 1200B. The sampling circuits 1200A and 1200B are connected in parallel between the charge pump 111A and a loop filter 113.

The charge pump 111A includes: current sources 1001 and 1004; and switches 1002, 1003A and 1003B. The current sources 1001 and 1004 and the switch 1002 are configured in the same way as in the first embodiment. The switch 1003A is turned on or off by the down signal DWN0 inputted from the phase comparator circuit 110A. Further, the switch 1003B is turned on or off by a down signal DWN00 inputted from the phase comparator circuit 110A.

The sampling circuit 1200A includes: switches 1120A and 1122A, a capacitor 1121A; and an amplifier 1123. The switch 2220A is turned on or off by a transmission signal EXE0 inputted from the phase comparator circuit 110A. The switch 1122A is turned on or off by a reset signal RST0 inputted from the phase comparator circuit 110A. The capacitor 1121A is discharged when the switch 1003A of the charge pump 111A is turned on by a down signal DWN0, while the capacitor 1121A is injected and charged with an electric charge from the output node 1135 when the switch 1120A is turned on by a transmission signal EXE0. By discharge of the capacitor 1121A, the down signal DWN0 is sampled to the sampling circuit 1200A, followed by charging the capacitor 1121A to transmit the down signal DWN0 to the loop filter 113. Further, after the capacitor 1121A discharges, the switch 1122A is turned on by a reset signal RST0 and then, the capacitor 1121A is charged by the amplifier 1123. Thereby, the sampling circuit 1200A once cancels the sampled down signal DWN0.

The sampling circuit 1200B includes: switches 1120B and 1122B; and a capacitor 1121B; and an amplifier 1123. The switch 1120B is turned on or off by a transmission signal EXE00. The switch 1122B is turned on or off by a reset signal RST00. The capacitor 1121B is discharged when the switch 1003B of the charge pump 111A is turned on by a down signal DWN00, while the capacitor 1121B is injected and charged with an electric charge from the output node 1135 when the switch 1120B is turned on by the transmission signal EXE00. By discharge of the capacitor 1121B, the down signal DWN00 is sampled to the sampling circuit 1200B, followed by charging the capacitor 1121B to transmit the down signal DWN00 to the loop filter 113. Further, after the capacitor 1121B discharges, the switch 1122B is turned on by the reset signal RST00 and then, the capacitor 1121B is charged by the amplifier 1123. Thereby, the sampling circuit 1200B once cancels the sampled down signal DWN00.

When the switch 1003A is turned on by a signal component D1 of a down signal DWN0 shown in FIG. 11, the capacitor 1121A discharges and the sampling circuit 1200A performs sampling of the signal component D1. Since a transmission signal EXE0 is at L level, the switch 1120A remains in the off state and the sampling circuit 1200A transmits no sampled signal component D1 to the loop filter 113. Thereafter, when a reset signal RST0 is inputted from the phase comparator circuit 110A, the switch 1122A is turned on for a period T1 of a reproduction clock CLK only and the capacitor 1121A is charged by the amplifier 1123. As a result, the sampled signal component D1 is canceled. Likewise, the signal component D2 of the down signal DWN0 is sampled to the sampling circuit 1200A and the capacitor 1121A is charged in a period T2 of a reproduction clock CLK. As a result, the sampled signal component D2 is canceled. That is, the sampling circuit 1200A cancels the down signal DWN0 bearing no relation to an edge of received data DIN.

Further, when the switch 1003B is turned on by a signal component D3 of a down signal DWN00 shown in FIG. 11, the capacitor 1121B discharges and the sampling circuit 1200B performs sampling of the signal component D3. When a transmission signal EXE00 is inputted from the phase comparator circuit 110A, the switch 1120B is turned on in a period T3 of a reproduction clock CLK and the capacitor 1120B is injected and charged with an electric charge from the output node 1135. Thereby, the capacitor 1121B is charged in the period T3 of a reproduction clock CLK and the sampled signal component D3 is transmitted to the loop filter 113. The loop filter 113 outputs a control voltage VC at a voltage level lowered by the signal component D3 to the voltage controlled oscillator 114 and the voltage controlled oscillator 114 generates a reproduction clock CLK having a phase adjusted based on the control voltage VC inputted.

Likewise, a signal component D4 of the down signal DWN00 is also sampled to the sampling circuit 1200B, thereafter, the switch 1120B is turned on by the transmission signal EXE00 in a period T4 of a reproduction clock CLK and further the capacitor 1121B is charged. The signal component D4 is transmitted to the loop filter 113 and phase adjustment of the reproduction clock CLK is performed as described above. That is, the sampling circuit 1200B transmits a down signal DWN based on a phase difference between received data DIN and a reproduction clock CLK to the loop filter 113. Note that since the reset signal RST00 is at L level, the switch 1122B remain in the off state and the signal components D3 and D4 sampled to the sampling circuit 1200B are not canceled.

Note that when an up signal UP inputted from the phase comparator circuit 110A, a voltage level of the control voltage VC is adjusted similar to the first embodiment.

As described above, the sampling circuit 1200A cancels a down signal DWN0 in a period of one cycle of a reproduction clock CLK and the sampling circuit 1200B transmits a down signal DWN00 to the loop filter 113 in a period of one cycle of a reproduction clock CLK. Accordingly, by use of the two sampling circuits 1200A and 1200B, a period in which the down signal DWN00 from the phase comparator circuit 110A is transmitted to the loop filter 113 and a period in which the down signal DWN0 from the phase comparator circuit 110A is canceled can be twice as large as that in the case of the first embodiment. As a result, even when a frequency of the recovery circuit 11A becomes twofold, a phase of a reproduction clock CLK can coincide with a phase of received data DIN and a low jitter reproduction clock CLK can be generated.

In the first embodiment, an operation of canceling the component k1 of a down signal DWN bearing no relation to an edge of received data DIN and an operation of transmitting the component k2 of a down signal DWN that has detected an edge of received data DIN are performed by one sampling circuit 112. Accordingly, in the first embodiment, periods of the above described operations cannot be doubled only by doubling a pulse component of a transmission signal EXE outputted by the AND gate 1105 and a pulse component of a reset signal RST outputted by the AND gate 1106 since the switches 1120 and 1122 have a period in which both switches are simultaneously turned on when pules components of the transmission signal EXE and the reset signal RST are simply doubled, thereby disabling correctly performing the above described two operations.

Therefore, it is indispensable to connect two sampling circuits in parallel as in the sampling circuit 112A of the second embodiment in order to lengthen periods in which the two operations are performed.

Figure 13:
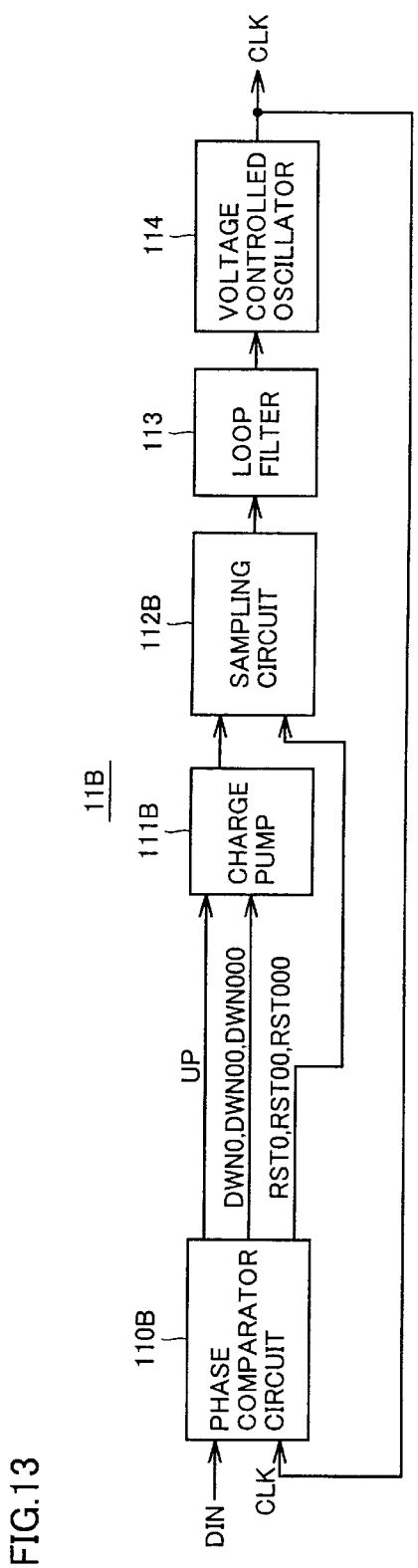
FIG. 13 is a simplified block diagram of the other constituents of the recovery circuit according to the second embodiment.

Further, a recovery circuit according to the second embodiment may be the recovery circuit 1B shown in FIG. 13. The recovery circuit 11B is the same as the recovery circuit 11 with the exception that in the recovery circuit 11, the phase comparator circuit 110, the charge pump 111 and the sampling circuit 112 are replaced with a phase comparator circuit 110B, a charge pump 111B and a sampling circuit 112B, respectively. The other parts of the configuration are the same as corresponding parts of the configuration of the recovery circuit 11.

The phase comparator circuit 10B outputs an up signal UP, down signals DWN0, DWN00 and DWN000 to the charge pump 111B and further outputs reset signals RST0, RST00 and RST000 to the sampling circuit 112B.

Figure 14:
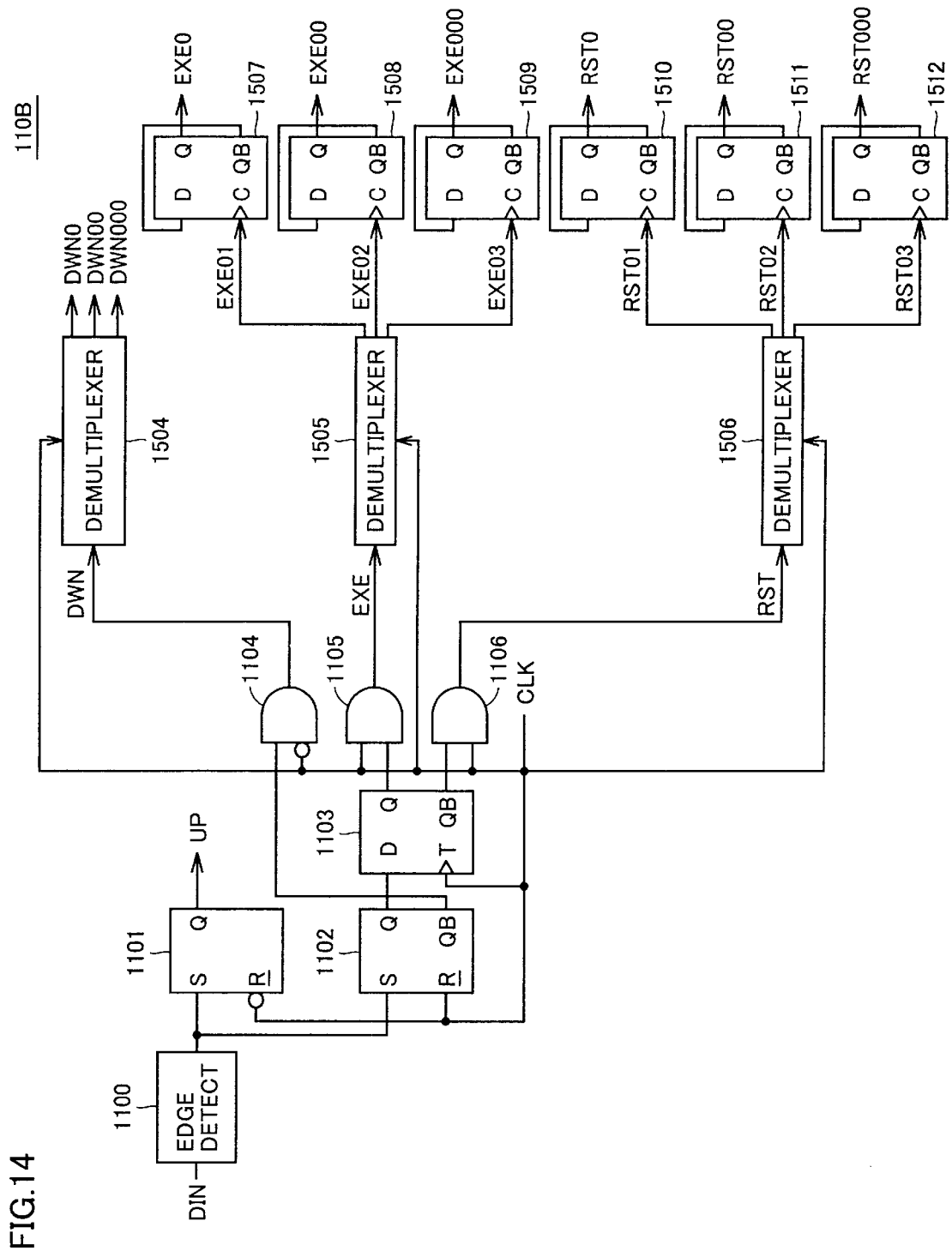
FIG. 14 is a circuit diagram of a phase comparator circuit in the recovery circuit shown in FIG. 13.

Referring to FIG. 14, the phase comparator circuit 110B is a circuit obtained by adding demultiplexers 1504 to 1506 and flip-flops 1507 to 1512 to the phase comparator circuit 110 and the other parts are the same as corresponding parts of the recovery circuit 110. The demultiplexer 1504 separates a down signal DWN into down signals DWN0, DWN00 and DWN000 in synchronism with a reproduction clock CLK. The demultiplexer 1505 separates a transmission signal EXE into transmission signals EXE01, EXE02 and EXE03 in synchronism with a reproduction clock CLK. The demultiplexer 1506 separates a reset signal RST into reset signals RST01, RST02 and RST03 in synchronism with a reproduction clock CLK.

The flip-flop 1507 outputs a transmission signal EXE0 having a pulse width twice that of a transmission signal EXE01. The flip-flop 1508 outputs a transmission signal EXE00 having a pulse width twice that of the transmission signal EXE02. The flip-flop 1509 outputs a transmission signal EXE000 having a pulse width twice that of the transmission signal EXE03. The flip-flop 1510 outputs a reset signal RST0 having a pulse width twice that of a reset signal RST01. The flip-flop 1511 outputs a reset signal RST00 having a pulse width twice that of a reset signal RST02. The flip-flop 1512 outputs a reset signal RST000 having a pulse width twice that of a reset signal RST03.

Figure 15:
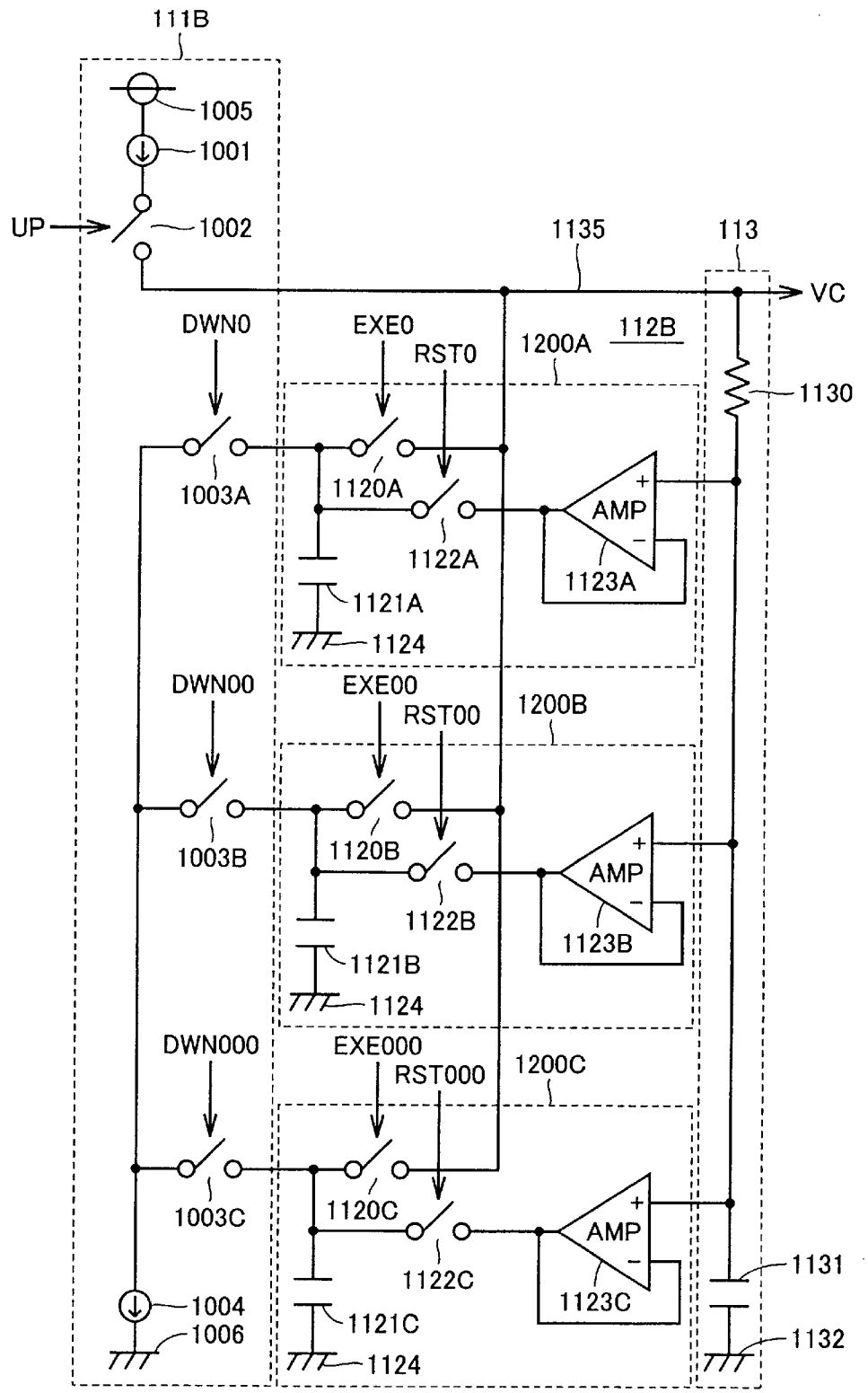
FIG. 15 is a circuit diagram of a charge pump, a sampling circuit and a loop filter in the recovery circuit shown in FIG. 13.

Referring to FIG. 15, the sampling circuit 112B includes: sampling circuits 1200A, 1200B and 1200C. The sampling circuits 1200A, 1200B and 1200C are connected in parallel between the charge pump 111B and the loop filter 113.

The charge pump 111B include current sources 1001 and 1004, switches 1002, 1003A, 1003B and 1003C. The current sources 1001 and 1004 and the switch 1002 are the same as corresponding parts of the first embodiment. The switch 1003A is turned on or off by a down signal DWN0 inputted from the phase comparator circuit 110B. Further, the switch 1003B is turned on or off by a down signal DWN00 inputted from the phase comparator circuit 110B. Still further, the switch 1003C is turned on or off by a down signal DWN000 inputted from the phase comparator circuit 110B.

The sampling circuit 1200A includes: switches 1120A and 1122A; a capacitor 1121A; and an amplifier 1123A. The switch 1120A is turned on or off by a transmission signal EXE0 inputted from the phase comparator circuit 110B. The switch 1122A is turned on or off by a reset signal RST0 inputted from the phase comparator circuit 100B. The capacitor 1121A discharges when the switch 1003A of the charge pump 111B is turned on by a down signal DWN0 and is injected and charged with an electric charge from the output node 1135 when the switch 1120A is turned on by a transmission signal EXE0. A down signal DWN0 is sampled to the sampling circuit 1200A by discharge of the capacitor 1121A and the down signal DWN0 is transmitted to the loop filter 113 by charging the capacitor 1121A. Further, when the switch 1122A is turned on by a reset signal RST0 after discharge of the capacitor 1121A, the capacitor 1121A is charged by the amplifier 1123A. With the charge, the sampling circuit 1200A cancels the down signal DWN0 that has been once sampled in the circuit.

The sampling circuit 1200B includes: switches 1120B and 1122B, a capacitor 1121B, and an amplifier 1123B. The switch 1120B is turned on or off by a transmission signal EXE00. The switch 1122B is turned on or off by a reset signal RST00. The capacitor 1121B discharges when the switch 1003B of the charge pump 111B is turned on by a down signal DWN00 and is injected and charged with an electric charge from the output node 1135 when the switch 1120B is turned on by a transmission signal EXE00. A down signal DWN00 is sampled to the sampling circuit 1200B by discharge of the capacitor 1121B and thereafter, the down signal DWN00 is transmitted to the loop filter 113 by charge of the capacitor 1121B. Further, when the switch 1122B is turned on by a reset signal RST00 after the capacitor 1121B discharges, the capacitor 1121B is charged by the amplifier 1123B. With the charge, the sampling circuit 1200B cancels the down signal DWN00 that has been once sampled in the circuit.

The sampling circuit 1200C includes: switches 1120C and 1122C, a capacitor 1121C; and an amplifier 1123C. The switch 1120C is turned on or off by a transmission signal EXE000. The switch 1122C is turned on or off by a reset signal RST000. The capacitor 1121C discharges when the switch 1003C of the charge pump 111B is turned on by a down signal DWN000 and is injected and charged with an electric charge from the output node 1135 when the switch 1120C is turned on by a transmission signal EXE000. A down signal DWN000 is sampled to the sampling circuit 1200C by discharge of the capacitor 1121C and thereafter, the down signal DWN000 is transmitted to the loop filter 113 by charge of the capacitor 1121C. Further, when the switch 1122C is turned on by a reset signal RST000 after the capacitor 1121C discharges, the capacitor 1121C is charged by the amplifier 1123C. With the charge, the sampling circuit 1200C cancels the down signal DWN000 that has been once sampled in the circuit.

The sampling circuits 1200A, 1200B and 1200C perform canceling operations of the signal components k1(see FIG. 6), each bearing no relation to an edge of received data DIN, of down signals DWN0, DWN00 and DWN000 when the signal components k1 are included in the down signals. Further, the sampling circuits 1200A, 1200B and 1200C perform transmitting operations of signal components k2 (see FIG. 6), each having detected an edge of received data DIN, of the down signal DWN0, DWN00 and DWN000 when the signal components k2 are included in the down signals.

An operation to cancel the signal component k1 and an operation to transmit the signal component k2 to the loop filter 113 are the same as those described above.

The three sampling circuits 1200A, 1200B and 1200C are, as described above, connected in parallel between the charge pump 111B and the loop filter 113 and thereby, an operation period in which to cancel the signal component k1 and an operation period in which to transmit the signal component k2 to the loop filter 113 can be made three times larger than the corresponding operation periods in the first embodiment. As a result, even when a frequency of the recovery circuit 11B increases threefold, a phase of a reproduction clock CLK can be made to coincide with a phase of received data DIN and a low jitter reproduction clock CLK can be correctly generated.

In the present invention, the number of sampling circuits connected in parallel between a charge pump and a loop filter is not limited to 2 or 3, but any plural number thereof may be generally accepted. In that case, a phase comparator circuit generates and outputs down signals and reset signals in respective numbers corresponding to the number of sampling circuits by means of the same method as that described above.

According to the second embodiment, an operation period in which to transmit a result of detection of an edge of received data and an operation period in which to cancel a down signal bearing no relation to an edge of received data can be longer in a recovery circuit; therefore; a low jitter reproduction clock CLK can be generated even when the reproduction clock is of a high frequency.

Third Embodiment

Figure 16:
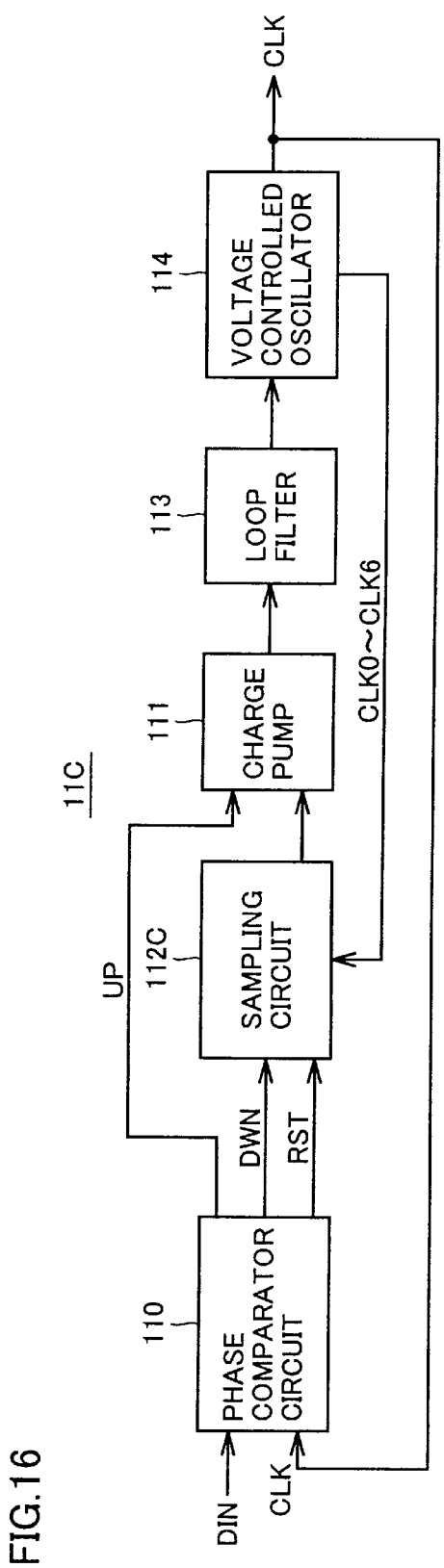
FIG. 16 is a simplified block diagram of a recovery circuit according a third embodiment.

Referring to FIG. 16, a recovery circuit 11C according the third embodiment is the same as the recovery circuit 11 according to the first embodiment with the exception that in the recovery circuit 11, the sampling circuit 112 is removed by replacing with the charge pump 111 and the sampling circuit 112C is substituted in a sampling circuit 112 instead thereof. The other parts of the configuration are similar to corresponding parts in the recovery circuit 11.

The phase comparator circuit 110 outputs an up signal to the charge pump 111 and outputs a down signal DWN and a reset signal RST to the sampling circuit 112C. Further, the voltage controlled oscillator 114 outputs 7 clocks CLK0 to CLK6 having different phases to the sampling circuit 112C.

Figure 17:
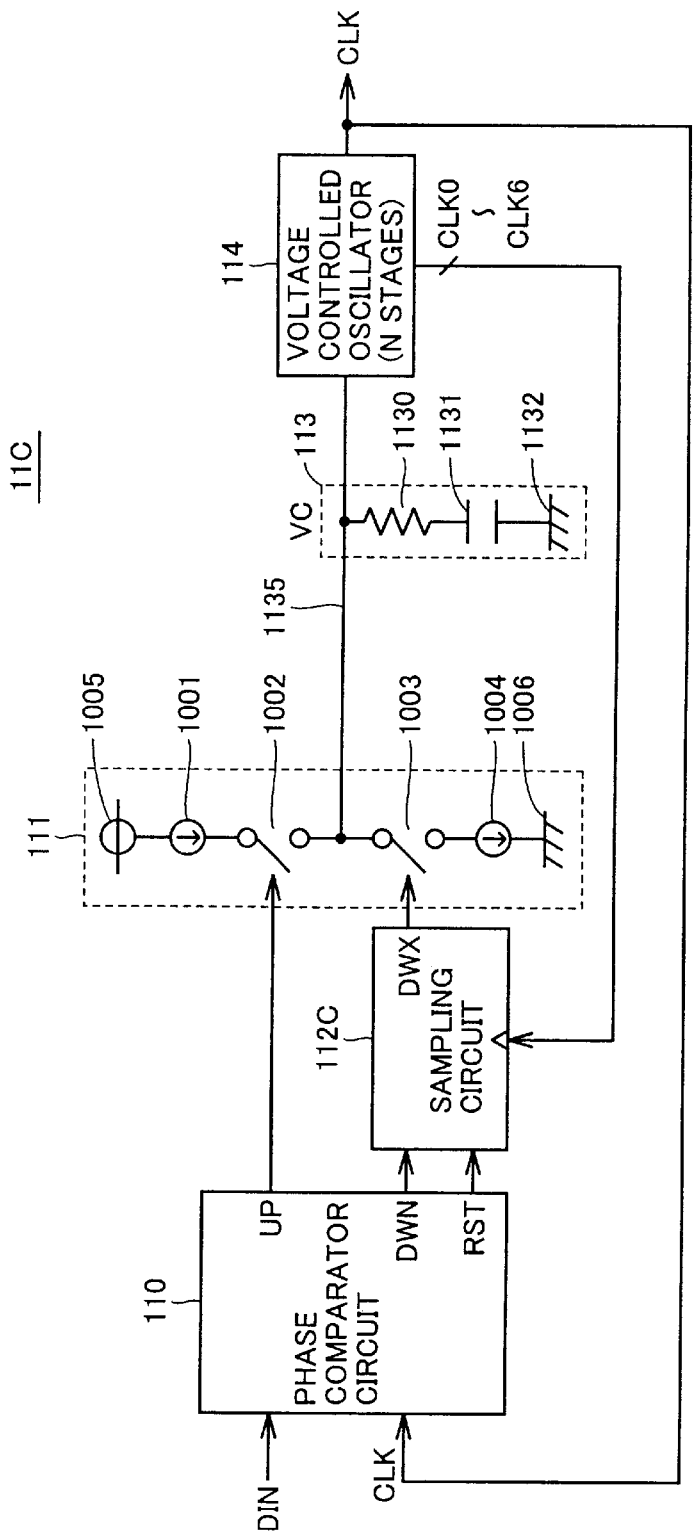
FIG. 17 is a block diagram and a circuit diagram for describing operations of the recovery circuit shown in FIG. 16.

Referring to FIG. 17, the sampling circuit 112C cancels a down signals bearing no relation to an edge of received data DIN based on a down signal DWN and a reset signal RST inputted from the phase comparator circuit 110 and clocks CLK0 to CLK6 from the voltage control oscillator 114 as described later, generates a reproduction clock DWX obtained by recovering a down signal DWN having detected an edge of received data DIN and transmits the reproduction signal DWX to the switch 1003 of the charge pump 111. Further, the phase comparator circuit 110 outputs an up signal UP to the switch 1002 of the charge pump 111.

When the up signal UP is inputted to the charge pump 111, the switch 1002 is turned on and a current is supplied to an output node 1135 from a power supply node 1005 through a current source 1001. With supply of the current, the capacitor 1131 of the loop filter 113 is charged to raise a voltage level of the control voltage VC. The loop filter 113 outputs the raised control voltage VC to the voltage controlled oscillator 114 to generate a reproduction clock CLK having a phase adjusted as described above.

When the reproduction signal DWX is inputted to the charge pump 111 from the sampling circuit 112C, the switch 1003 is turned on, an electric charge of the capacitor 1131 is discharged to a ground node 1006 through the output node 1135 by the current source 1004. With the discharge, a voltage level of the control voltage VC falls and the loop filter 113 outputs the lowered control voltage VC to the voltage controlled oscillator 114 to generate a reproduction clock CLK having a phase adjusted as described above.

Figure 18:
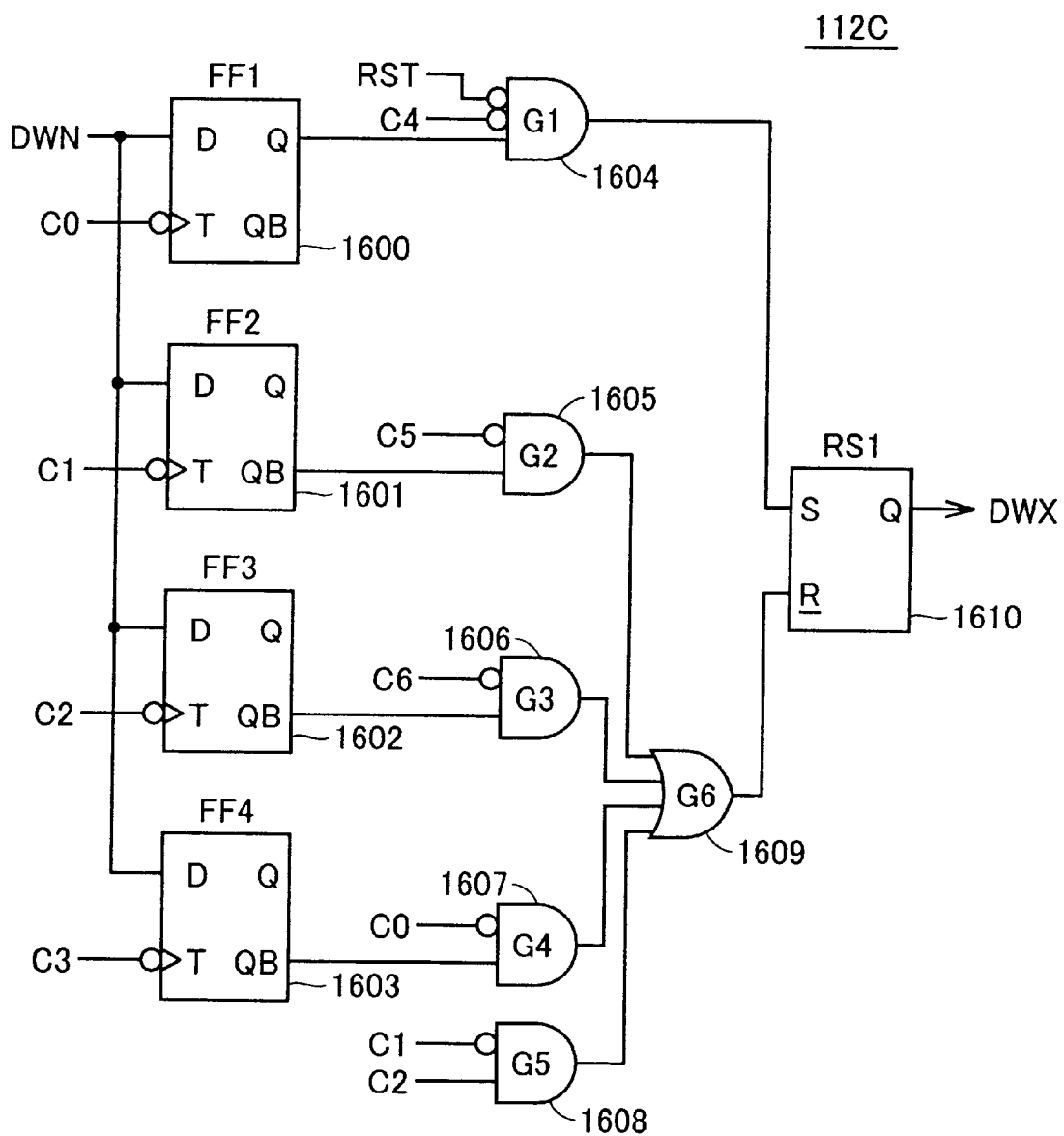
FIG. 18 is a circuit diagram of a sampling circuit in the recovery circuit shown in FIG. 16.

Referring to FIG. 18, the sampling circuit 112C includes flip-flops 1600 to 1603, AND gates 1604 to 1608, an OR gate 1609, and an RS latch 1610. The flip-flop 1600 performs sampling of a down signal DWN in synchronism with the falling edge C0 of a clock CLK0 inputted from the voltage controlled oscillator 114 to output the down signal DWN to the AND gate 1604. The flip-flop 1601 performs sampling of a down signal DWN in synchronism with the falling edge C1 of a clock CLK1 inputted from the voltage controlled oscillator 114 to output an inverted signal thereof to the AND gate 1605. The flip-flop 1602 performs sampling of a down signal DWN in synchronism with the falling edge C2 of a clock CLK2 inputted from the voltage controlled oscillator 114 to output an inverted signal thereof to the AND gate 1606. The flip-flop 1603 performs sampling of a down signal DWN in synchronism with the falling edge C3 of a clock CLK3 inputted from the voltage controlled oscillator 114 to output an inverted signal thereof to the AND gate 1607.

The AND gate 1604 generates a logical product of an inverted signal of a reset signal RST and an output signal of the flip-flop 1600 in synchronism with the falling edge C4 of a clock CLK4 from the voltage controlled oscillator 114 to input the result thereof to the set input of the RS latch circuit 1610. The AND gate 1605 resets the RS latch circuit 1610 in synchronism with the falling edge C5 of a clock CLK5 from the voltage controlled oscillator 114 when an inverted output of the flip-flop 1601 is at H level. The AND gate 1606 resets the RS latch circuit 1610 in synchronism with the falling edge C6 of a clock CLK6 from the voltage controlled oscillator 114 when an inverted output of the flip-flop 1602 is at H level. The AND gate 1607 resets the RS latch circuit 1610 in synchronism with the falling edge C0 of a clock CLK0 when an inverted output of the flip-flop 1603 is at H level. The AND gate 1608 resets the RS latch circuit 1610 according to whether samplings at an edge C2 of a clock CLK2 and an edge C3 of a clock CLK3 is at H or L level. The OR gate 1609 generates a logical sum of output signals of the AND gate 1605, 1606, 1607 and 1608 to input an operation result thereof to the reset input of the RS latch circuit 1610. The RS latch circuit 1610 resets an output signal of the AND gate 1604 by an output signal of the OR gate 1609 to output a reproduction signal DWX.

Figure 19:
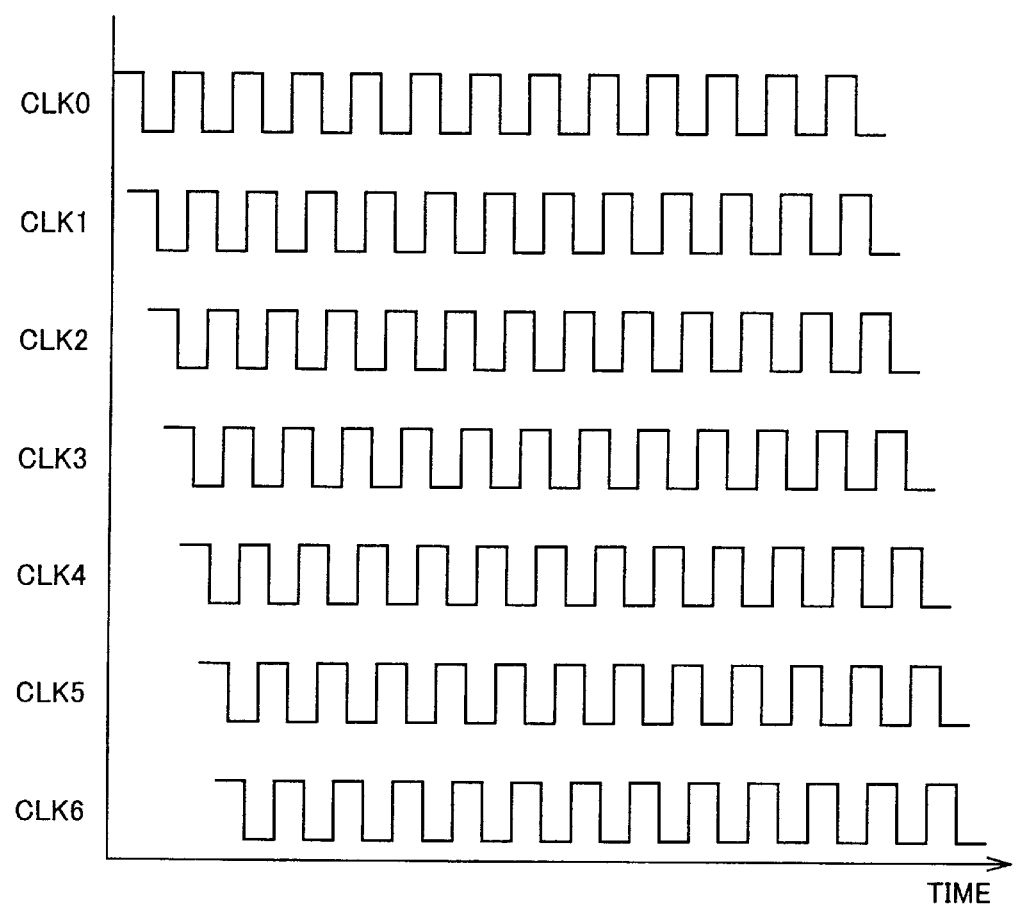
FIG. 19 is a timing chart of clocks outputted from a voltage controlled oscillator in the recovery circuit shown in FIG. 16.

As shown in FIG. 19, clocks CLK0 to CLK6 inputted from the voltage controlled oscillator 114 have a prescribed phase difference between the clocks. The clocks CLK0 to CLK6 are clocks outputted from respective stages of the ring oscillator shown in FIG. 8.

Figure 20:
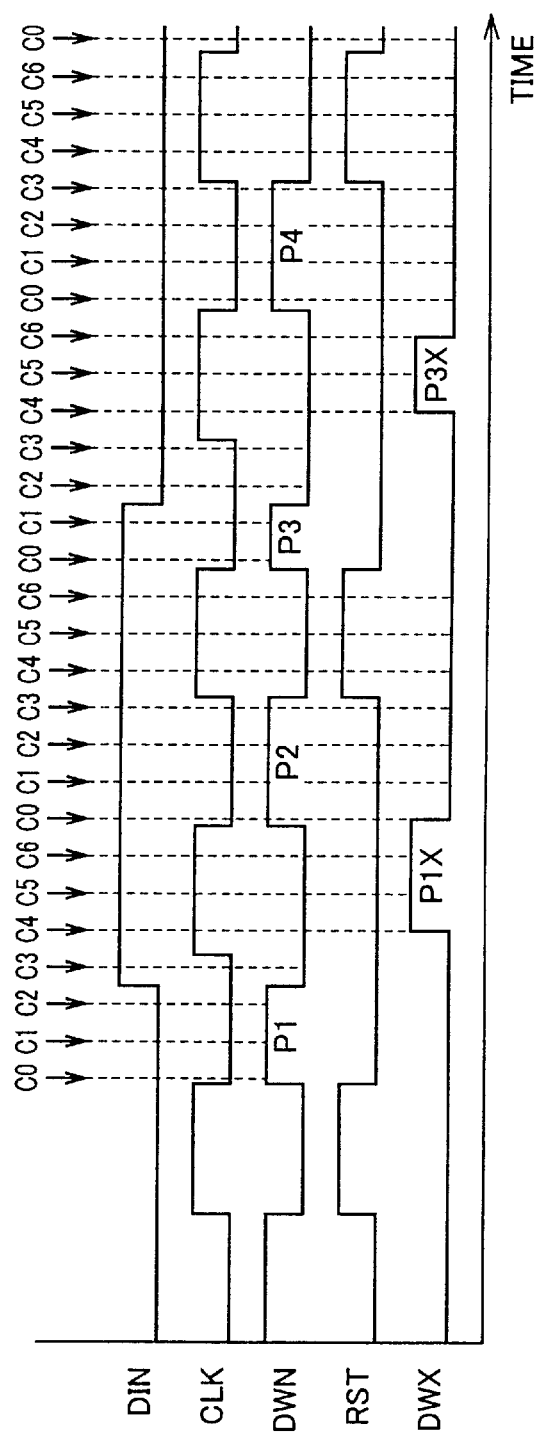
FIG. 20 is a timing chart of signals for describing operations of reproduction and cancellation of a down signal in a sampling circuit shown in FIG. 19.

Referring to FIG. 20, description will be given of operation for generating a reproduction signal DWX in the sampling circuit 112C. FIG. 20 shows a case where a reproduction clock CLK leads received data DIN in phase. The phase comparator circuit 110 compares a phase of a reproduction clock CLK with a phase of received data DIN by means of the method described above to output a down signal DWN and a reset signal RST to the sampling circuit 112C.

Description will be given first of reproduction of a pulse component P1 of a down signal DWN. The flip-flop 1600 of the sampling circuit 112C performs sampling of the pulse component P1 of a down signal DWN in synchronism with the falling edge C0 of a clock CLK0 to output a signal of H level to the AND gate 1604. The flip-flop 1601 performs sampling of a down signal DWN in synchronism with the falling edge C1 of a clock CLK1 to output an inverted signal of L level of the signal of H level to the AND gate 1605. The flip-flop 1602 performs sampling of a down signal DWN in synchronism with the falling edge C2 of a clock CLK2 to output an inverted signal of L level of the signal of H level to the AND gate 1606. The flip-flop 1603 performs sampling of a down signal DWN in synchronism with the falling edge C3 of a clock CLK3 to output an inverted signal of H level of the signal of L level to the AND gate 1607.

A reset signal RST is at L level and an output signal of the flip-flop 1600 is at H level at the falling edge C4 of a clock CLK4; therefore, the AND gate 1604 inputs the signal of H level to the set input of the RS latch circuit 1610. With input of the signal of H level, the RS latch circuit 1610 outputs a reproduction signal DWX of H level at the edge C4.

Since the flip-flop 1601 outputs a signal of H level to the AND gate 1605, the AND gate 1605 does not reset the RS latch circuit 1610 at the falling edge C5 of a clock CLK5 and the RS latch circuit 1610 outputs a reproduction signal DWX of H level. Since the flip-flop 1602 outputs a signal of L level to the AND gate 1606, the AND gate 1606 does not reset the RS latch circuit 1610 at the falling edge C6 of a clock CLK6 and the RS latch circuit 1610 outputs a reproduction signal DWX of H level. Since the flip-flop 1603 outputs a signal of H level to the AND gate 1607, the AND gate 1607 resets the RS latch circuit 1610 at the falling edge C0 of a clock CLK0 and the RS latch circuit 1610 outputs a reproduction signal DWX of L level. Thereby, the pulse component P1 of a down signal DWN is reproduced as a reproduction signal component P1X.

Likewise, a pulse component P2 of a down signal DWN is sampled at timings of the falling edges C0 to C3 of the respective clocks CLK0 to CLK3. Accordingly, the flip-flop 1600 outputs a signal of H level to the AND gate 1604 and the flip-flop 1601 outputs a signal of L level to the AND gate 1605. Further, the flip-flop 1602 outputs a signal of L level to the AND gate 1606 and the flip-flop 1603 outputs a signal of L level to the AND gate 1606.

In this situation, since a reset signal RST is at H level at the falling edge C4 of a clock CLK4, the AND gate 1604 outputs a signal of L level to the set input of the RS latch circuit 1610. The RS latch circuit 1610 outputs a reproduction signal DWX of L level. Since the flip-flop 1601 outputs a signal of L level, the AND gate 1605 does not reset the RS latch circuit 1610 in synchronism with the falling edge C5 of a clock CLK5 and the RS latch circuit 1610 outputs a reproduction signal DWX of L level. Since the flip-flop 1602 outputs a signal of L level, the AND gate 1606 does not reset the RS latch circuit 1610 at the falling edge C6 of a clock CLK6 and the RS latch circuit 1610 outputs a reproduction signal DWX of L level. Since the flip-flop 1603 outputs a signal of L level, the AND gate 1607 does not reset the RS latch circuit 1610 at the falling edge C0 of a clock CLK0 and the RS latch circuit 1610 outputs a reproduction signal DWX of L level. Thereby, the pulse component P2 of a down signal DWN is canceled.

Next, description will be given of recovery of a pulse component P3 of a down signal DWN. The flip-flop 1600 performs sampling of a down signal DWN in synchronism with the falling edge C0 of a clock CLK0 to output a signal of H level to the AND gate 1604. The flip-flop 1601 performs sampling of a down signal DWN in synchronism with the falling edge C1 of a clock CLK1 to output a signal of L level to the AND gate 1605. The flip-flop 1602 performs sampling of a down signal DWN in synchronism with the falling edge C2 of a clock CLK2 to output a signal of H level to the AND gate 1606. The flip-flop 1603 performs sampling of a down signal DWN in synchronism with the falling edge C3 of a clock CLK3 to output a signal of H level to the AND gate 1606.

A reset signal RST is at L level at the falling edge C4 of a clock CLK4 and the flip-flop 1600 outputs a signal of H level; therefore, the AND gate 1604 outputs a signal of H level to the set input of the RS latch circuit 1610. Further, the RS latch circuit 1610 outputs a reproduction signal DWN of H level. Since the flip-flop 1601 outputs a signal of L level, the AND gate 1605 does not reset the RS latch circuit 1610 in synchronism with the falling edge C5 of a lock CLK5 and the RS latch circuit 1610 outputs a reproduction signal DWX of H level. Since the flip-flop 1602 outputs a signal of L level, the AND gate 1606 resets the RS latch circuit 1610 in synchronism with the falling edge C6 of a lock CLK6 and the RS latch circuit 1610 outputs a reproduction signal DWX of L level. Since the flip-flop 1603 outputs a signal of H level, the AND gate 1607 resets the RS latch circuit 1610 in synchronism with the falling edge C0 of a lock CLK0 and the RS latch circuit 1610 outputs a reproduction signal DWX of L level. Thereby, the pulse component P3 of a down signal DWN is reproduced as a signal component P3X.

A pulse component P4 of a down signal DWN is sampled at the falling edges C0 to C3 of the respective clocks CLK0 to CLK3. Accordingly, the flip-flop 1600 outputs a signal of H level to the AND gate 1604 and the flip-flop 1601 outputs a signal of L level to the AND gate 1605. Further, the flip-flop 1602 outputs a signal of L level to the AND gate 1606 and the flip-flop 1603 outputs a signal of L level to the AND gate 1606.

In this situation, since a reset signal RST is at H level at the falling edge C4 of a clock CLK4, the AND gate 1604 outputs a signal of L level to the set input of the RS latch circuit 1610 and the RS latch circuit 1610 outputs a reproduction signal DWX of L level. Since the flip-flop 1601 outputs a signal of L level, the AND gate 1605 does not reset the RS latch circuit 1610 in synchronism with the falling edge C5 of a clock CLK5 and the RS latch circuit 1610 outputs a reproduction signal DWX of L level. Since the flip-flop 1602 outputs a signal of L level, the AND gate 1606 does not reset the RS latch circuit 1610 in synchronism with the falling edge C6 of a clock CLK6 and the RS latch circuit 1610 outputs a reproduction signal DWX of L level. Since the flip-flop 1603 outputs a signal of L level, the AND gate 1607 does not reset the RS latch circuit 1610 at the falling edge C0 of a clock CLK0 and the RS latch circuit 1610 outputs a reproduction signal DWX of L level. Thereby, the pulse component P4 of a down signal DWN is canceled.

The sampling circuit 112C, as described above, reproduces the signal components P1 and P3 of a down signal DWN and cancel the signal components P3 and P4. The signal components P1 and P3 are components having detected an edge of received data DIN and the signal components P2 and P4 are signal components bearing no relation to an edge of received data DIN. Accordingly, the sampling circuit 112C reproduces the signal components P1 and P3 having detected a edge of the receiving data DIN as reproduction signals P1X and P3X and cancels the signal components P2 and P4 bearing no relation to an edge of the received data DIN.

Referring again to FIG. 17, the switch 1003 of the charge pump 111 is turned on by the signal components P1X and P3X when a reproduction signal DWX is inputted from the sampling circuit 112C. Then, the capacitor 1131 of the loop filter 113 discharges to lower a voltage level of the control voltage VC. In this case, the current source 1004 supplies a current according to widths of reproduction signals P1X and P3X to the ground node 1006 from the output node 1135. That is, when a current value of the current source 1004 is [I] by definition, a value of current flowing to the ground node 1006 from the output node 1135 by the reproduction signal P1X is [I]×3 (a time length between the falling edge C4 of a clock CLK4 and the falling edge C0 of a clock CLK0), while a value of current flowing into the ground node 1006 from the output node 1135 by the reproduction signal P3X is [I]×2 (a time length between the falling edge C4 of a clock CLK4 and the falling edge C6 of a clock CLK6).

In the operation described above, the signal components P1 and P3 of a down signal having detected an edge of received data DIN are transmitted to the loop filter 113. Further, the loop filter 113 outputs a control voltage VC having a lowered voltage level to the voltage controlled oscillator 114 and a reproduction clock CLK having a phase corresponding to a voltage level of the control voltage VC is generated.

Note that a phase adjusting operation of a reproduction clock CLK when an up signal UP is inputted to the charge pump 111 from the phase comparator circuit 110 is the same as that of the first embodiment.

Figure 21:
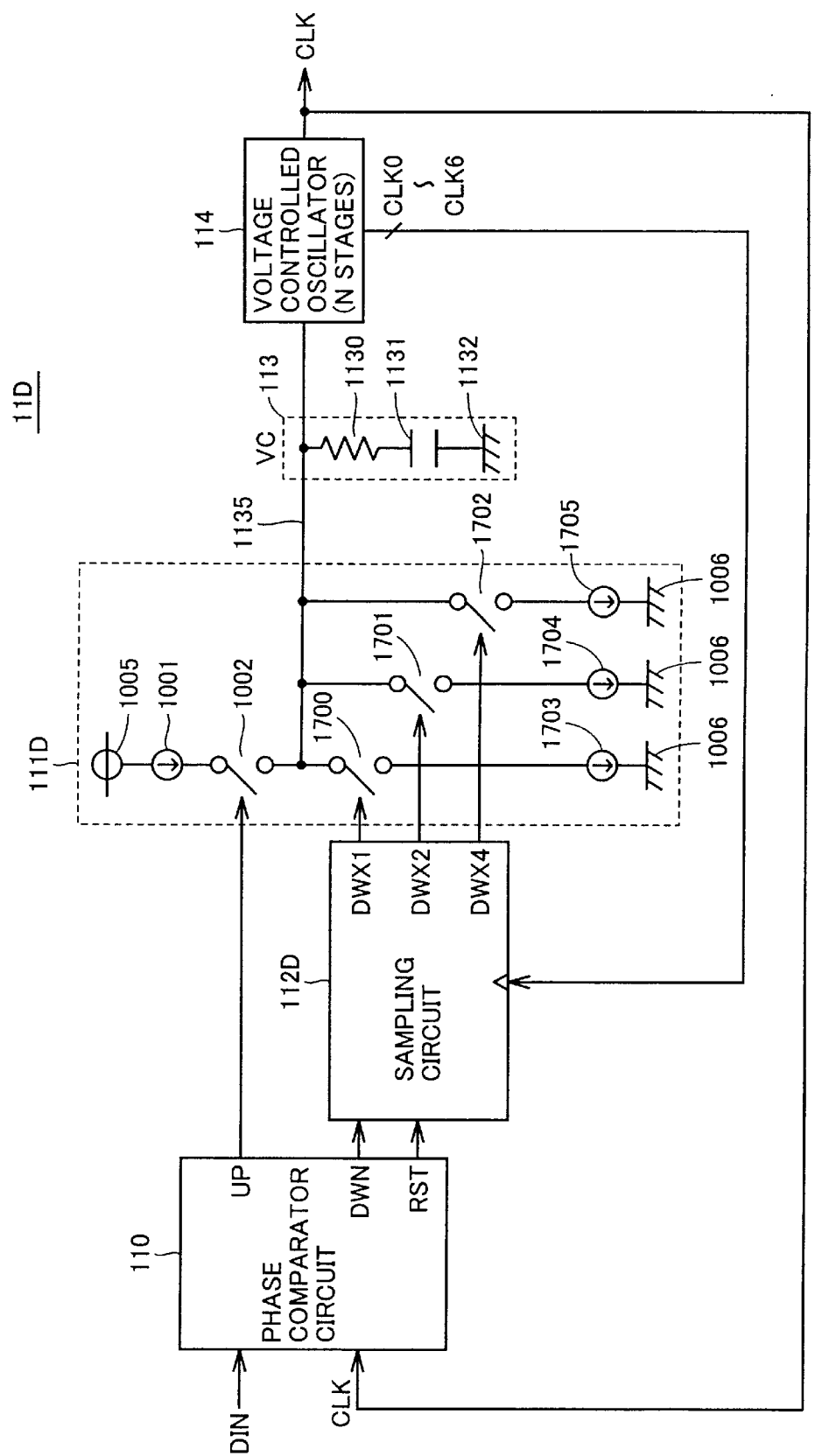
FIG. 21 is a simplified block diagram of the other constituents of the recovery circuit according to the third embodiment.

A recovery circuit according to the third embodiment may be a recovery circuit 11D shown in FIG. 21. The recovery circuit 11D is the same as the recovery circuit 11C with the exception that in the recovery circuit 11C, the charge pump 111 is replaced with a charge pump 11D and the sampling circuit 112C is replaced with a sampling circuit 112D. The other parts are the same as corresponding parts of the recovery circuit 11C.

The charge pump 111D includes: current sources 100 1and 1703 to 1705; and switches 1002 and 1700 to 1702. The current source 1001 and the switch 1002 are configured to be the same as those of the first embodiment. The switch 1700 and the current source 1703 are connected in series between the output node 1135 and the ground node 1006 and by turning-on of the switch 1700, the current source 1703 forces a current [I] to flow to the ground node 1006 from the output node 1135. The switch 1701 and the current source 1704 are connected in series between the output node 1135 and the ground node 1006 and by turning-on of the switch 1701, the current source 1704 forces a current of a value [I]×2 to flow to the ground node 1006 from the output node 1135. The switch 1702 and the current source 1705 are connected in series between the output node 1135 and the ground node 1006 and by turning-on of the switch 1702, the current source 1705 forces a current of a value [I]×4 to flow to the ground node 1006 from the output node 1135.

The sampling circuit 112D generates reproduction signals DWX1, DWX2 and DWX4 based on a down signal DWN and a reset signal RST from the phase comparator circuit 110, and clocks CLK0 to CLK6 from the voltage control oscillator 114 by means of a method described later and outputs the reproduction signals DWX1, DWX2 and DWX4 to the respective switches 1700 to 1702.

Figure 22:
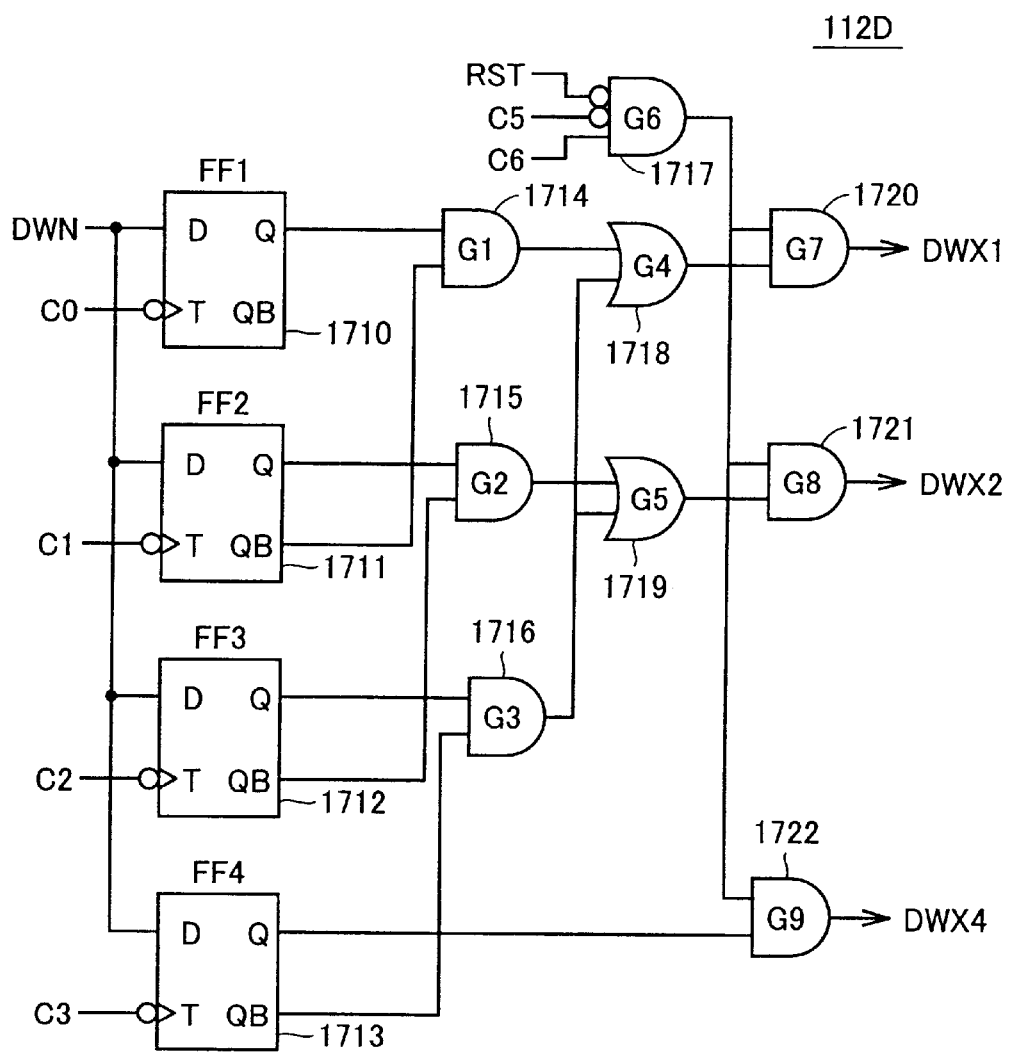
FIG. 22 is a circuit diagram of a sampling circuit in the recovery circuit shown in FIG. 21.

Referring to FIG. 22, a sampling circuit 112D includes flip-flops 1710 to 1713 AND gates 1714 to 1717 and 1720 to 1722 and OR gates 1718 and 1719. The flip-flop 1710 performs sampling of a down signal DWN from the phase comparator circuit 110 in synchronism with the falling edge C0 of a clock CLK0 from the voltage controlled oscillator 114 to output an output signal to the AND gate 1714. The flip-flop 1711 performs sampling of a down signal DWN from the phase comparator circuit 110 in synchronism with the falling edge C1 of a clock CLK1 from the voltage controlled oscillator 114 to output an output signal to the AND gate 1715 and output an inverted output signal to the AND gate 1714. The flip-flop 1712 performs sampling of a down signal DWN from the phase comparator circuit 110 in synchronism with the falling edge C2 of a clock CLK2 from the voltage controlled oscillator 114 to output an output signal to the AND gate 1716 and output an inverted output signal to the AND gate 1715. The flip-flop 1713 performs sampling of a down signal DWN from the phase comparator circuit 110 in synchronism with the falling edge C3 of a clock CLK3 from the voltage controlled oscillator 114 to output an output signal to the AND gate 1722 and output an inverted output signal to the AND gate 1716.

The AND gate 1714 generates a logical product of an output signal of the flip-flop 1710 and an inverted output signal of the flip-flop 1711 to output a result of the operation to the OR gate 1718. The AND gate 1715 generates a logical product of an output signal of the flip-flop 1711 and an inverted output signal of the flip-flop 1712 to output a result of the operation to the OR gate 1719. The AND gate 1716 generates a logical product of an output signal of the flip-flop 1712 and an inverted output signal of the flip-flop 1713 to output a result of the operation to the OR gates 1718 and 1719.

The AND gate 1717 generates reproduction signals DWX1, DWX2 and DWX4 between the falling edge C5 of a clock CLK5 and the falling edge C6 of a clock CLK6 when a reset signal RST is at L level. The OR gate 1718 generates a logical sum of an output signal of the AND gate 1714 and an output signal of the AND gate 1719 to output a result of the operation to the AND gate 1720. The OR gate 1719 generates a logical sum of an output signal of the AND gate 1715 and an output of the AND gate 1716 to output a result of the operation to the AND gate 1721. The AND gate 1720 outputs a reproduction signal DWX1 when an output signal of the AND gate 1717 is at H level. The AND gate 1721 outputs a reproduction signal DWX2 when an output signal of the AND gate 1717 is at H level. The AND gate 1722 outputs a reproduction signal DWX4 when an output signal of the AND gate 1717 is at H level.

Figure 23:
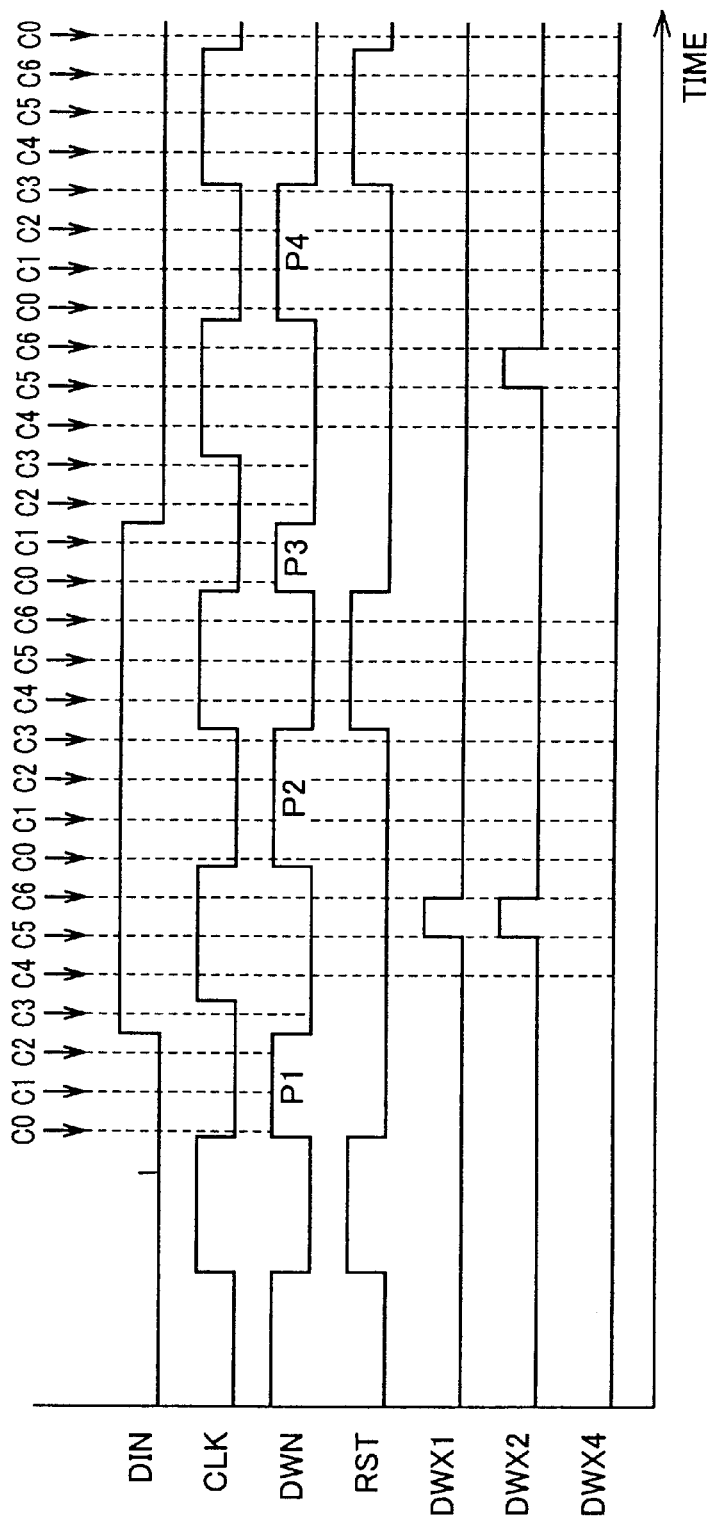
FIG. 23 is a timing chart of signals for describing operations of reproduction and cancellation of a down signal in the sampling circuit shown in FIG. 22.
Figure 24:
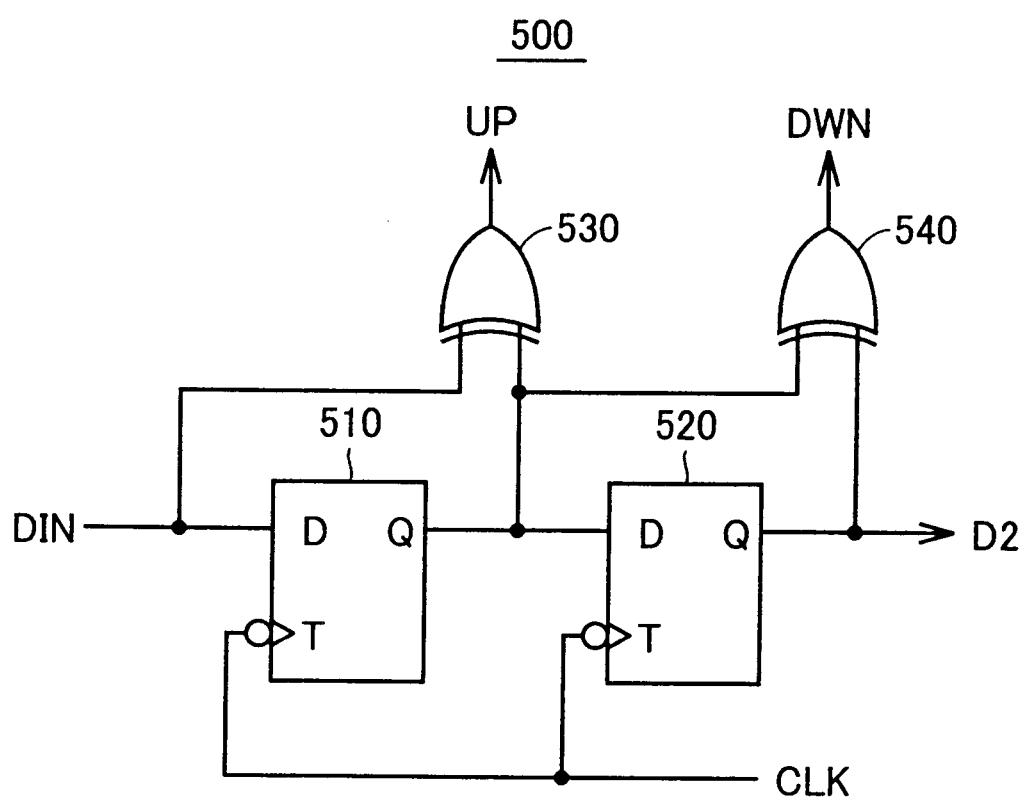
FIG. 24 is a circuit diagram of a conventional phase comparator circuit.
Figure 25A:
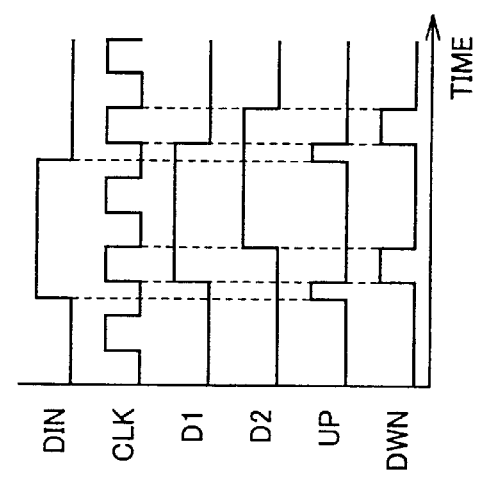
FIG. 25A is a timing chart of signals outputted from the phase comparator circuit shown in FIG. 24 when a phase of a reproduction clock coincides with a phase of received data.
Figure 25B:
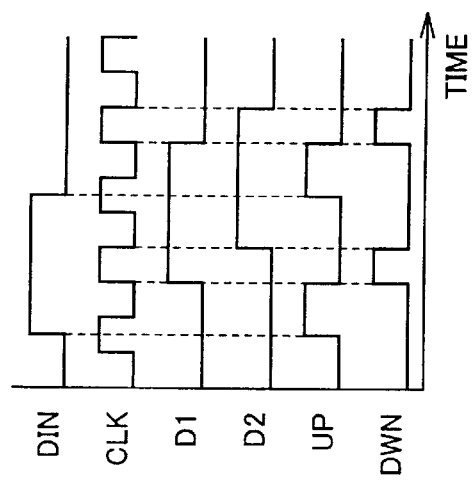
FIG. 25B is a timing chart of signals outputted from the phase comparator circuit shown in FIG. 24 when a reproduction clock is delayed as compared to received data in phase.
Figure 25C:
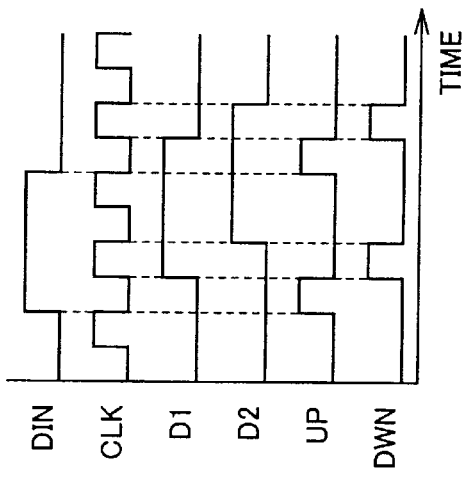
FIG. 25C is a timing chart of signals outputted from the phase comparator circuit shown in FIG. 24 when a reproduction clock leads received data in phase.

Referring to FIG. 23, description will be given of reproduction of a down signal DWN. FIG. 23 shows a case where a reproduction clock CLK leads received data DIN in phase. Description will be first of recovery of the pulse component P1 of a down signal DWN. The flip-flop 1710 performs sampling of the pulse component P1 in synchronism with the falling edge C0 of a clock CLK0 to output a signal of H level to the AND gate 1714. The flip-flop 1711 performs sampling of the pulse component P1 in synchronism with the falling edge C1 of a clock CLK1 to output a signal of H level to the AND gate 1715 and output an inverted output signal of L level to the AND gate 1714. The flip-flop 1712 performs sampling of the pulse component P1 in synchronism with the falling edge C2 of a clock CLK2 to output a signal of H level to the AND gate 1716 and output an inverted output signal of L level to the AND gate 1715. The flip-flop 1713 performs sampling of the pulse component P1 in synchronism with the falling edge C3 of a clock CLK3 to output a signal of L level to the AND gate 1722 and output an inverted output signal of H level to the AND gate 1716.

The AND gate 1714 generates a logical product of an output signal of H level from the flip-flop 1710 and an inverted output signal of L level from the flip-flop 1711 to output a signal of L level to the OR gate 1718. The AND gate 1715 generates a logical of an output signal of H level from the flip-flop 1711 and an inverted output signal of L level from the flip-flop 1712 to output a signal of L level to the OR gate 1719. The AND gate 1716 generates a logical product of an output signal of H level from the flip-flop 1712 and an inverted output signal of H level from the flip-flop 1713 to output a signal of H level to the OR gates 1718 and 1719.

Then, the OR gates 1718 and 1719 output signals each of H level to the respective AND gates 1720 and 1721. Since a reset signal RST is at L level at the falling edge C5 of a clock CLK5 and the falling edge C6 of a clock CLK6, the AND gate 1717 outputs a signal of H level at the edge C5 and a signal of L level at the edge C6. Hence, the AND gates 1720 and 1721 outputs respective reproduction signals DWX1 and DWX2 each of H level at the edge C5 and the AND gate 1722 outputs a reproduction signal DWX4 of L level since the AND gate 1722 is inputted with a signal of L level from the flip-flop 1713. Further, the AND gates 1720 to 1722 output respective reproduction signals DWX1, DWX2 and DWX4 of L level since the AND gate 1717 outputs a signal of L level at the edge C6.

Description will be given of cancellation of the pulse component P2 of a down signal DWN. The flip-flop 1710 performs sampling of the pulse component P2 in synchronism with the falling edge C0 of a clock CLK0 to output a signal of H level to the AND gate 1714. The flip-flop 1711 performs sampling of the pulse component P2 in synchronism with the falling edge C1 of a clock CLK1 to output a signal of H level to the AND gate 1715 and a signal of L level to the AND gate 1714. The flip-flop 1712 performs sampling of the pulse component P2 in synchronism with the falling edge C2 of a clock CLK2 to output a signal of H level to the AND gate 1716 and a signal of L level to the AND gate 1715. The flip-flop 1713 performs sampling of the pulse component P2 in synchronism with the falling edge C3 of a clock CLK3 to output a signal of H level to the AND gate 1722 and a signal of L level to the AND gate 1716.

Thereafter, the AND gate 1714 outputs a signal of L level to the OR gate 1718, the AND gate 1715 outputs a signal of L level to the OR gate and the AND gate 1716 outputs a signal of L level to the OR gates 1718 and 1719. Then, the OR gate 1718 outputs a signal of L level to the AND gate 1720 and the OR gate 1719 outputs a signal of L level to the AND gate 1721.

Since a reset signal RST is at H level at the falling edges C4, C5 and C6 of respective clocks CLK4, CLK5 and CLK6, the AND gate 1717 outputs signals each of L level to the respective AND gates 1720 to 1722. Accordingly, the AND gates 1720 to 1722 output respective signals each of L level and the pulse component P2 of a down signal DWN is canceled.

Description will be given of detection of the pulse component P3 of a down signal DWN. The flip-flop 1710 performs sampling of the pulse component P3 in synchronism with the falling edge C0 of a clock CLK0 to output a signal of H level to the AND gate 1714. The flip-flop 1711 performs sampling of the pulse component P3 in synchronism with the falling edge C1 of a clock CLK1 to output a signal of H level to the AND gate 1715 and a signal of L level to the AND gate 1714. The flip-flop 1712 performs sampling of the pulse component P3 in synchronism with the falling edge C2 of a clock CLK2 to output a signal of L level to the AND gate 1716 and a signal of H level to the AND gate 1715. The flip-flop 1713 performs sampling of the pulse component P3 in synchronism with the falling edge C3 of a clock CLK3 to output a signal of L level to the AND gate 1722 and a signal of H level to the AND gate 1716.

Then, the AND gate 1714 outputs a signal of L level to the OR gate 1718, the AND gate 1715 outputs a signal of H level to the OR gate 1719 and the AND gate 1716 outputs signals each of L level to the OR gates 1718 and 1719. Thereafter, the OR gate 1718 outputs a signal of L level to the AND gate 1720 and the OR gate 1719 outputs a signal of H level to the AND gate 1721.

Since a reset signal RST is at L level at the falling edges C5 and C6 of respective clocks CLK5 and CLK6, the AND gate 1717 outputs signals each of H level to the respective AND gates 1720 to 1721 for a period between the edge C5 and the edge C6. As a result, the AND gate 1720 outputs a reproduction signal DWX1 of L level, the AND gate 1721 outputs a reproduction signal DWX2 of H level and the AND gate 1722 outputs a reproduction signal DWX4 of L level. In such a way, the pulse component P3 of a down signal DWN is reproduced as a reproduction signal DWX2.

Cancellation of the pulse component P4 of a down signal DWN is the same as that of the pulse component P2.

The pulse components P1 and P3 in a down signal DWN are signal components having detected an edge of received data DIN and the pulse components P2 and P4 thereof are signal components bearing no relation to an edge of received data DIN. Hence, the sampling circuit 112D reproduces the signal components P1 and P3 of a down signal DWN having detected an edge of received data DIN as reproduction signals DWX1 and DWX2 and cancels the signal components P2 and P4 bearing no relation to an edge of the received data DIN.

The sampling circuit 112D generates a reproduction signal DWX1 when sampling of a down signal DWN in synchronism with the edge C0 of a clock CLK0 is at H level, and sampling of a down signal at the edge C2 of a clock CLK2 and the edge C3 of a clock CLK3 is at L level, while the sampling circuit 112D generates a reproduction signal DWX2 when sampling of a down signal DWN in synchronism with the edge C0 of a clock CLK0 and the edge C1 of a clock CLK1 is at H level, and sampling of a down signal DWN at the edge C2 of a clock CLK2 and the edge C3 of a clock CLK2 is at L level.

The sampling circuit 112D generates reproduction signals DWX1 and DWX2 when sampling of a down signal DWN in synchronism with the edge C0 of a clock CLK0, the edge C1 of a clock CLK1 and the edge C2 of a clock CLK2 is at H level, and sampling of a down signal DWN at the edge C3 of a clock CLK3 is at L level, while the sampling circuit 112D generates a reproduction signal DWX4 when sampling of a down signal DWN in synchronism with the edge C0 of a clock CLK0, the edge C1 of a clock CLK1, the edge C2 of a clock CLK2 and the edge C3 of a clock CLK3 is at H level.

Referring again to FIG. 21, when the sampling circuit 112D outputs a reproduction signal DWX1 which is only one signal of H level among reproduction signals, the switch 1700 is turned on while the switches 1701 and 1702 are turned off. In this situation, the capacitor 1131 of the loop filter 113 discharges and an accumulated electric charge in the capacitor 1131 flows as a current with a value [I] to the ground node 1006 from the output node 11354 through the current source 1703.

Further, when the sampling circuit 112D outputs a reproduction signal DWX2 which is only one signal of H level among reproduction signals, the switch 1701 is turned on, while the switches 1700 and 1702 are turned off. In this situation, the capacitor 1131 of the loop filter 113 discharges and an accumulated electric charge in the capacitor 1131 flows as a current with a value 2×[I] to the ground node 1006 from the output node 11354 through the current source 1704.

Still further, when the sampling circuit 112D outputs a reproduction signal DWX4 which is only one signal of H level among reproduction signals, the switch 1702 is turned on, while the switches 1700 and 1701 are turned off. In this situation, the capacitor 1131 of the loop filter 113 discharges and an accumulated electric charge in the capacitor 1131 flows as a current with a value 4×[I] to the ground node 1006 from the output node 11354 through the current source 1705.

Yet further, when the sampling circuit 112D outputs reproduction signals DWX1 and DWX2 which are ones of H level with the other of L level, the switches 1700 and 1701 are turned on, while the switch 1702 is turned off. In this situation, the capacitor 1131 of the loop filter 113 discharges and an accumulated electric charge in the capacitor 1131 flows as a current with a value [I]+2×[I]=3×[I] to the ground node 1006 from the output node 11354 through the current sources 1703 and 1704.

Accordingly, the reproduction signals DWX1, DWX2 and DWX4 outputted from the sampling circuit 112D assign corresponding weights to currents flowing into the ground node 1006 from the output node 1135 in the charge pump 111D to transmit the pulse components P1 and P3 having different widths included in a down signal DWN to the charge pump 111D. That is, the pulse component P1 sampled at the edges C0 to C2 of 3 clocks is reproduction as a reproduction signal DWX1 of a current value with a weight of 1×[I] and a reproduction signal DWX2 of a current value with a weight of 2×[I]. Further, the pulse signal P3 sampled at the edge C0 and C1 of 2 clocks is reproduced as a reproduction signal DWX2 of a current value with a weight of 2×[I]. This applies to the other pulses in a similar way.

When reproduction signals DWX1, DWX2 and DWX4 are inputted to the charge pump 111D, the capacitor 1131 discharges electric charges corresponding to the respective current values. With the discharge, a voltage level of the control voltage VC falls according to a discharged amount of electricity and the loop filter 113 outputs the control voltage VC having a lowered level to the voltage controlled oscillator 114.

Thereafter, a reproduction clock CLK having a phase corresponding to a voltage level of the control voltage VC is generated by the same operation as that in the first embodiment.

The recovery circuit 11C shown in FIG. 17 reproduction a pulse component of a down component DWN having detected an edge of received data DIN as a signal having an assigned weight associated with a time for which a current flows through the single current source 1004. In contrast to this, the recovery circuit 11D shown in FIG. 21 reproduces a pulse component DWN having detected an edge of received data DIN as a signal having an assigned weight associated with a value of a current flowing for a prescribed period. Hence, the two recovery circuits 11C and 11D have a common nature in that each transmits a down signal DWN to the loop filter 113 such that the capacitor 1131 of the loop filter 113 discharges an electric charge corresponding to a pulse width of a pulse component of a down signal DWN having detected an edge of received data DIN.

Further, the recovery circuits 11C and 11D have another common nature in that each cancels a signal component bearing no relation to an edge of received data DIN by a digital signal processing.

According to the third embodiment, a signal component of a down signal DWN having detected an edge of received data is reproduced in digital processing to transmit the reproduction signal to a loop filter while a signal component bearing no relation to an edge of received data is canceled in digital processing; therefore, the loop filter has only to lower a level of a control voltage only when a down signal necessary for phase adjustment of a reproduction clock is transmitted and the loop filter can thus generate a low jitter reproduction clock. Further, since a signal component of a down signal is reproduced or canceled in digital processing, phase adjustment of a reproduction clock can be performed at high speed.

Although the present invention has been described and illustrated in detail, it is clearly understood that the same is by way of illustration and example only and is not be taken by way of limitation, the spirit and scope of the present invention being limited only by the terms of the appended claims.

What is claimed is:

1. A recovery circuit comprising:
   a phase comparator circuit comparing a phase of a reproduction clock with a phase of received data, outputting an up signal when said reproduction clock is delayed as compared to said received data in phase and said phase comparator circuit detects an edge of said received data in a first period in which said reproduction clock is a first logic, and outputting a down signal composed of a first component having a detected edge of said received data in a second period in which said reproduction clock is a second logic and a second component indicating that a logic of said received data being a constant logic has been detected in said second period when said reproduction clock leads said received data in phase;
   a control voltage adjusting circuit raising a control voltage when said up signal is inputted, lowering said control voltage when said first component of said down signal is inputted and canceling said second component of said down signal to hold said control voltage when said second component of said down signal is inputted; and
   a voltage controlled oscillator generating a reproduction clock whose phase is altered according to a level of said control voltage to output the generated reproduction clock to said phase comparator circuit.

2. The recovery circuit according to claim 1, wherein said control voltage adjusting circuit comprises:
   a loop filter raising or lowering said control voltage based on a supplied electric charge;
   a charge pump circuit supplying a first electric charge for raising said control voltage based on said up signal and supplying a second electric charge for lowering said control voltage based on said down signal; and
   a sampling circuit supplying said first electric charge to said loop filter circuit, and supplying said second electric charge to said loop filter circuit after holding said second electric charge for a prescribed period when said first component is inputted and canceling said second electric charge when said second component is inputted.

3. The recovery circuit according to claim 2, wherein said phase comparator circuit further outputs a transmission signal for transmitting said second electric charge to said loop filter circuit when said first component is inputted and a reset signal for canceling said second electric charge when said second component is inputted; and
   said sampling circuit performs sampling and holding said second electric charge when said down signal is inputted to said charge pump circuit, is rendered to be conductive with said loop filter circuit when said transmission signal is inputted, and holds said control voltage at a constant level and equalizes a sampling value to said control voltage when said reset signal is inputted.

4. The recovery circuit according to claim 3, wherein a plurality of said sampling circuits are connected in parallel between said charge pump circuit and said loop filter circuit.

5. The recovery circuit according to claim 3, wherein said sampling circuit comprises:
   a capacitance element performing sampling and holding said second electric charge discharged from said charge pump circuit;
   a first switch controlled by said transmission signal;
   a second switch controlled by said reset signal; and
   an analog buffer equalizing a voltage of said capacitance element to said control voltage.

6. The recovery circuit according to claim 1, wherein said control voltage adjusting circuit cancels said second component of said down signal in a digital signal processing.

7. The recovery circuit according to claim 6, wherein said voltage controlled oscillator further generates a plurality of clocks with different phases, and
   wherein said control voltage adjusting circuit comprises:
      an output node supplying said control voltage to said voltage controlled oscillator;
      a sampling circuit receiving said plurality of clocks as inputs, performing sampling of said first and second components of said down signal inputted from said phase comparator circuit using said plurality of clocks to reproduce said first component only and outputting a reproduction signal thereof;
a charge pump circuit supplying a first electric charge for raising said control voltage based on said up signal from said phase comparator circuit and receiving a second electric charge for lowering said control voltage based on said reproduction signal from said sampling circuit; and
a loop filter circuit raising said control voltage on said output node based on said first electric charge and lowering said control voltage on said output node based on said second electric charge.

8. The recovery circuit according to claim 7, wherein said phase comparator circuit further outputs a reset signal and said sampling circuit cancels said second component of said down signal when said reset signal is sampled in succession to sampling of said second component of said down signal using said plurality of clocks.

9. The recovery circuit according to claim 7, wherein said sampling circuit generates said reproduction signal such that a current is held constant and a time length for which said current is forced to flow is altered in response to a width of said first component of said down signal and thereby, said charge pump circuit receives said second electric charge.

10. The recovery circuit according to claim 7, wherein said sampling circuit generates said reproduction signal such that a time length for which a current flows is held at a constant value and a current value is altered in response to a width of said first component of said down signal, and thereby said charge pump circuit receives said second electric charge.

* * * * *